US012733316B2

(12) United States Patent
Holmes et al.

(10) Patent No.: US 12,733,316 B2
(45) Date of Patent: Sep. 8, 2026

(54) LIGHT-EMITTING DIODE WITH SPECTRALLY SELECTIVE OPTICAL ELEMENT

(71) Applicant: Lumileds LLC, San Jose, CA (US)

(72) Inventors: Mark James Holmes, San Jose, CA (US); Robert Armitage, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 370 days.

(21) Appl. No.: 18/517,721

(22) Filed: Nov. 22, 2023

(65) Prior Publication Data

US 2025/0169250 A1 May 22, 2025

(51) Int. Cl.
*H10H 20/855* (2025.01)
*H10H 20/825* (2025.01)
*H10W 90/00* (2026.01)

(52) U.S. Cl.
CPC ........ *H10H 20/855* (2025.01); *H10H 20/825* (2025.01); *H10W 90/00* (2026.01)

(58) Field of Classification Search
None
See application file for complete search history.

(56) References Cited

U.S. PATENT DOCUMENTS

2023/0138761 A1 5/2023 Armitage et al.
2023/0324689 A1* 10/2023 Sizov .................. G02B 6/0031 359/601
2023/0369299 A1 11/2023 Chen et al.
2025/0037645 A1 1/2025 Watanabe et al.

FOREIGN PATENT DOCUMENTS

JP 2002-217454 A 8/2002
WO 2023/106049 A1 6/2023

OTHER PUBLICATIONS

Machine-generated English translation of JP 2002277454 (Year: 2002).*
Machine-generated English translation of WO 2023/106049 (Year: 2023).*
From the EPO as the ISA, Notification of Transmittal of the International Search Report and the Written Opinion of the International Searching Authority, or the Declaration, PCT/US2024/053950, Feb. 10, 2025, 9 pages.

* cited by examiner

*Primary Examiner* — Bo B Jang

(57) ABSTRACT

A light-emitting device includes red InGaN-based LED(s), green III-nitride-based LED(s), and blue III-nitride-based LED(s), which respectively emit red emitted light, green emitted light, and blue emitted light. Spectrally selective optical element(s), on which at least the red emitted light is incident, result in red output light having a red output color point, green output light having a green output color point, and blue output light having a blue output color point. The red, green, and blue output color points define a color gamut that encompasses at least an sRGB color gamut, in some examples even when corresponding color points of the red, green, and blue emitted light do not.

21 Claims, 16 Drawing Sheets

200
100
204

100
102
104

200
102
204

294
200

192
100

294
200

98R
99R
502R
98G
99G
502G
98B
99B
502B
510

LIGHT-EMITTING DIODE WITH SPECTRALLY SELECTIVE OPTICAL ELEMENT

FIELD OF THE INVENTION

The field of the present invention relates to light-emitting diodes (LEDs). In particular, LEDs are disclosed that include spectrally selective optical elements.

BACKGROUND

Semiconductor light-emitting diodes and laser diodes (collectively referred to herein as "LEDs") are among the most efficient light sources currently available. The emission spectrum of an LED typically exhibits a single relatively narrow peak at a wavelength determined by the structure of the device and by the composition of the semiconductor materials from which it is constructed. By suitable choice of device structure and material system, LEDs may be designed to operate at ultraviolet, visible, or infrared wavelengths.

In some examples the light produced by a semiconductor LED serves as the output light; such LEDs are often referred to as direct emitters, or direct-emitting LEDs. In other examples LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer. Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and/or desired color-rendering properties.

Multiple LEDs (direct-emitting or phosphor-converted) can be formed together on a single substrate to form an array. Such arrays can be employed to form active illuminated displays, such as those employed in, e.g., smartphones and smart watches, computer or video displays, signage, or visualization systems (such as augmented- or virtual-reality displays), or to form adaptive illumination sources, such as those employed in, e.g., automotive headlights, street lighting, camera flash sources, or flashlights (i.e., torches). An array having one or several or many individual devices per millimeter (e.g., device pitch or spacing of about a millimeter, a few hundred microns, less than 100 microns, or even less, and separation between adjacent devices less than 100 microns or only a few microns or even less) typically is referred to as a miniLED array or a microLED array (alternatively, a μLED array). Such miniLED or microLED arrays can be direct-emitting or phosphor-converted (or a mixture of both types).

SUMMARY

An inventive light-emitting device includes one or more red InGaN-based light-emitting diodes (LEDs), one or more green III-nitride-based LEDs, one or more blue III-nitride-based LEDs, and one or more spectrally selective optical elements. The red, green and blue LEDs emit red, green, and blue emitted light, respectively. The one or more spectrally selective optical elements are positioned and arranged so that (i) at least the red emitted light is incident on one or more of the spectrally selective optical elements, and (ii) output portions of the red, green, or blue emitted light exit the device as red output light characterized by a red output color point, green output light characterized by a green output color point, and blue output light characterized by a blue output color point, respectively. The red, green, and blue output color points define a color gamut that encompasses at least an sRGB color gamut, in some examples even when corresponding color points of the red, green, and blue emitted light do not.

Objects and advantages pertaining to LEDs with spectrally selective optical elements may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Figures 1, 2A, 2B:
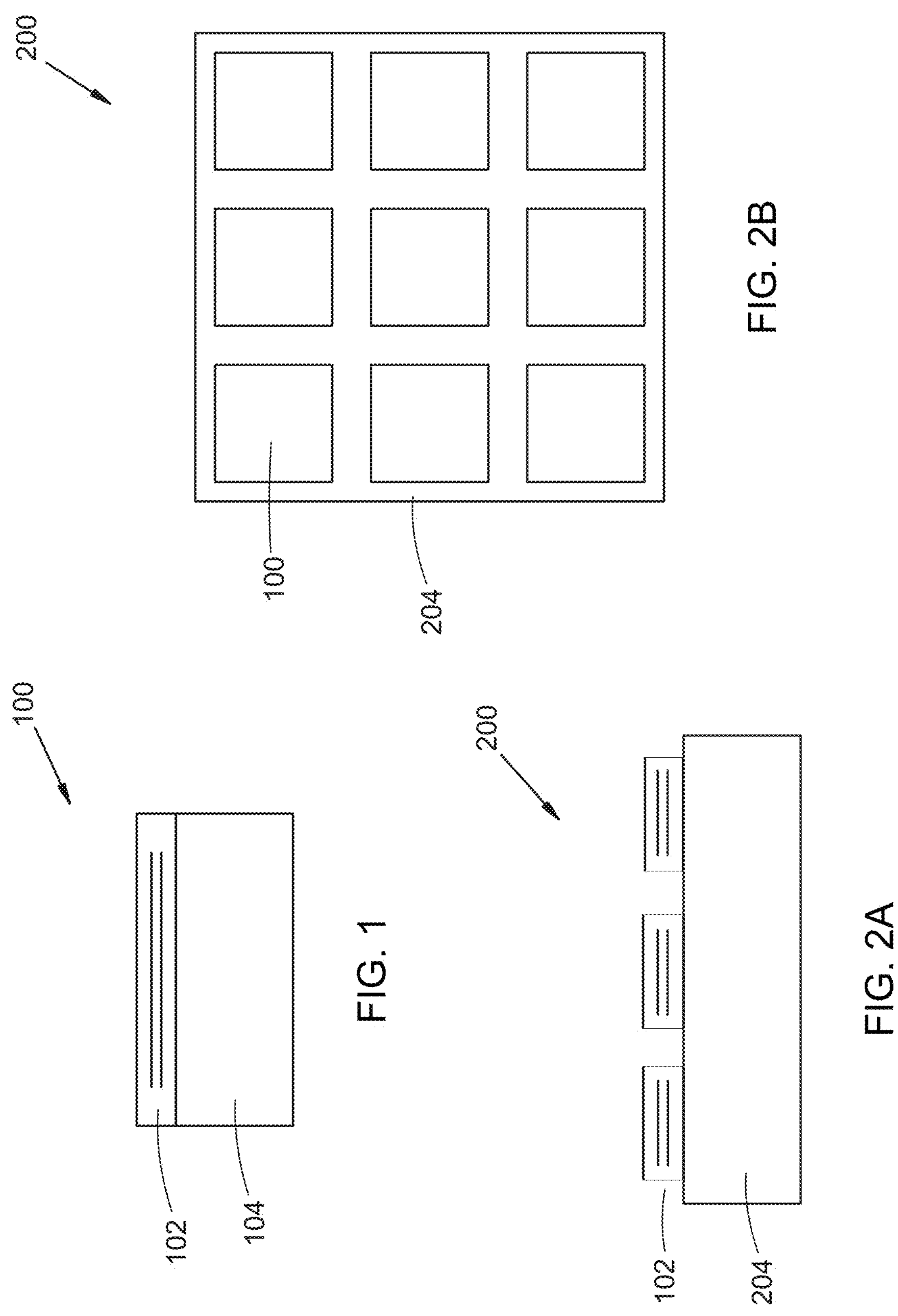
FIG. 1 shows a schematic cross-sectional view of an example LED.
FIGS. 2A and 2B show, respectively, cross-sectional and top schematic views of an example array of LEDs.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. In particular, many details of the semiconductor LED layer structure, electrodes, contacts, light barriers, and so forth are omitted from the schematic diagrams of FIGS. 6A-6C and 7. In the drawings some schematic illustrations of example structures of various devices and assemblies described herein may be shown with precise right angles and straight lines, but it is to be understood that such schematic illustrations may not reflect real-life process limitations or defects. Such process limitations or defects can cause the features to look not so “ideal” when any of the structures described herein are examined using, e.g., scanning electron microscopy (SEM) images or transmission electron microscope (TEM) images. In such images of real structures, possible processing limitations or defects might be visible, e.g., not-perfectly straight edges of materials, tapered vias or other openings, inadvertent rounding of corners or variations in thicknesses of different material layers. There may be other limitations or defects not listed here that can occur within the field of device fabrication. The embodiments shown are only examples and should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the inventive subject matter. The detailed description illustrates by way of example, not by way of limitation, the principles of the inventive subject matter. For purposes of simplicity and clarity, detailed descriptions of well-known devices, circuits, and methods may be omitted so as not to obscure the description of the inventive subject matter with unnecessary detail.

FIG. 1 shows an example of an individual light-emitting diode 100 comprising a semiconductor diode structure 102 disposed on a substrate 104, together considered herein an “LED” or “semiconductor LED”. Semiconductor diode structure 102 typically comprises an active region disposed between n-type and p-type layers. Application of a suitable forward bias across the diode structure 102 results in emission of light from the active region due to radiative recombination of charge carriers. The wavelength of the emitted light is determined by the composition and structure of the active region. The LED may be, for example, a III-nitride LED that emits blue, green, or red light. LEDs formed from any other suitable material system and that emit any other suitable wavelength of light may also be used, e.g., other binary, ternary, or quaternary alloys of gallium, aluminum, indium, nitrogen, phosphorus, or arsenic (i.e., III-V materials).

FIGS. 2A and 2B show, respectively, cross-sectional and top views of an array 200 of LEDs 100 (including red, green, and blue LEDs 102R/102G/102B) disposed on a substrate 204. Such an array can include any suitable number of LEDs arranged in any suitable manner. In the illustrated example the array is depicted as formed monolithically on a shared substrate, but alternatively an array of LEDs can be formed from separate individual LEDs (e.g., singulated devices that are assembled onto an array substrate) or separate groups of multiple LEDs that are assembled together. In segmented monolithic examples individual LEDs can be electrically isolated from each other, e.g., by trenches and or electrically insulating material. In some instances the array 200 can include light barriers (e.g., reflective, scattering, diffusive, and/or absorbing) between adjacent LEDs 102 to provide optical isolation from one another.

Substrate 204 may optionally include electrical traces or interconnects, or CMOS or other circuitry for driving the LEDs, and may be formed from any suitable materials. The individual LEDs (pixels) in an LED array may be individually addressable, may be addressable as part of a group or subset of the pixels in the array, or may not be addressable. Thus, LED arrays can be useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

Figure 2C:
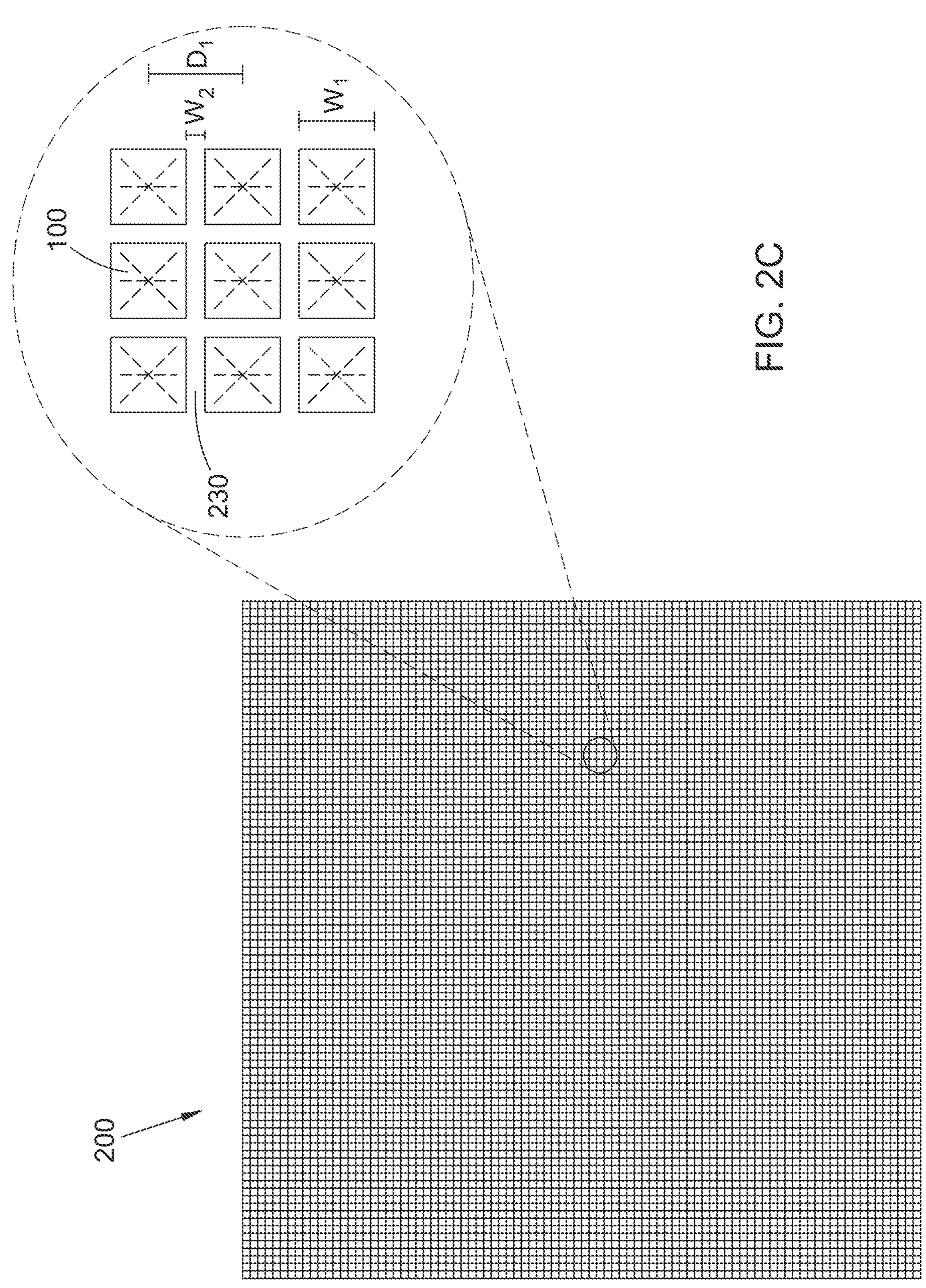
FIG. 2C shows a top schematic view of another example miniLED or microLED array and an enlarged section of 3×3 LEDs of the array.

Although FIGS. 2A and 2B show a 3×3 array of nine LEDs, such arrays may include for example on the order of $10^1$, $10^2$, $10^3$, $10^4$, or more LEDs, e.g., as illustrated schematically in FIG. 2C. Individual LEDs 100 (i.e., pixels) may have non-zero widths $w_1$ (e.g., side lengths or transverse dimensions) in the plane of the array 200, for example, less than or equal to 1 millimeter (mm), less than or equal to 500 microns, less than or equal to 100 microns, less than or equal to 50 microns, less than or equal to 10 microns, or even smaller (as discussed below). LEDs 100 in the array 200 may be spaced apart from each other by streets, lanes, or trenches 230 having a non-zero width $w_2$ in the plane of the array 200 of, for example, hundreds of microns, less than or equal to 100 microns, less than or equal to 50 microns, less than or equal to 20 microns, less than or equal to 10 microns, less than or equal to 5 microns, or even smaller (as discussed below). The pixel pitch or spacing $D_1$ is the sum of $w_1$ and $w_2$. Although the illustrated examples show identical rectangular LEDs arranged in a symmetric matrix with uniform size, separation, and spacing, the LEDs and the array may have any suitable shape or arrangement, whether symmetric or asymmetric, uniformly or non-uniformly sized, uniformly or non-uniformly spaced, or uniformly or non-uniformly separated. Multiple separate arrays of LEDs can be combined in any suitable arrangement in any applicable format to form a larger combined array or display.

LEDs having dimensions $w_1$ in the plane of the array (e.g., side lengths or transverse dimensions) of less than or equal to about 0.10 millimeters microns are typically referred to as microLEDs, and an array of such microLEDs may be referred to as a microLED array. LEDs having dimensions $w_1$ in the plane of the array (e.g., side lengths or transverse dimensions) of between about 0.1 millimeters and about 1.0 millimeters are typically referred to as miniLEDs, and an array of such miniLEDs may be referred to as a miniLED array.

Figure 2D:
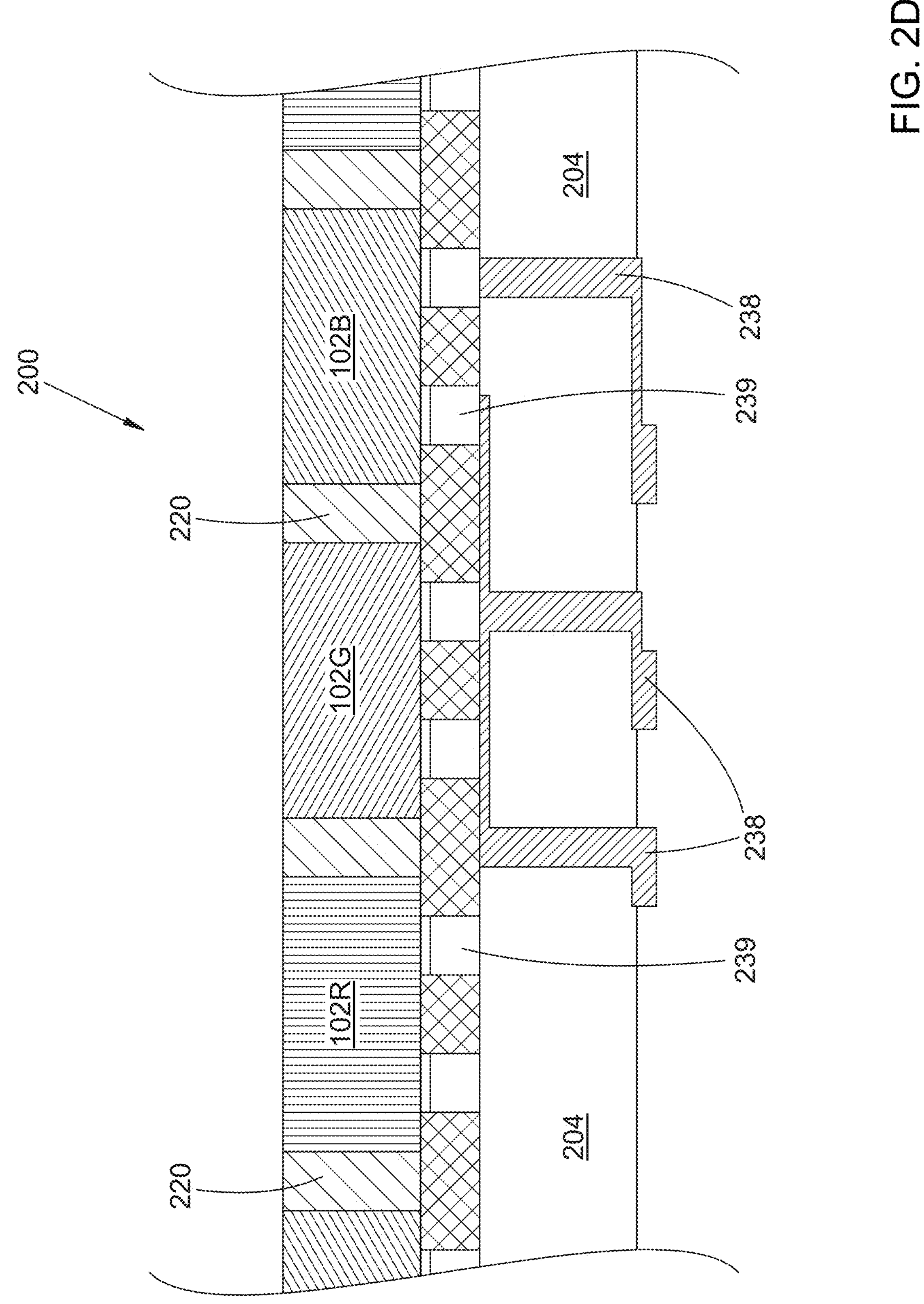
FIG. 2D is a side cross-sectional schematic diagram of an example of a close-packed array of multi-colored LEDs on a monolithic die and substrate.

An array of LEDs, miniLEDs, or microLEDs, or portions of such an array, may be formed as a segmented monolithic structure in which individual LED pixels are electrically isolated from each other, e.g., by trenches and/or insulating material. FIG. 2D is a schematic cross-sectional view of a close packed array 200 of multi-colored LEDs 102 on a monolithic die and substrate 204. The side view shows III-nitride LEDs 102 attached to the substrate 204 through metal interconnects 239 (e.g., gold-gold interconnects or solder attached to copper micropillars) and metal interconnects 238. The semiconductor LED pixels 102 can be coated on their sides with a reflective mirror or diffusive scattering layer to form an optical isolation barrier 220 (which in some instances can also act as an electrical isolation barrier). In this example each LED pixel 102 is one of three different colors, e.g., red LEDs 102R, green LEDs 102G, and blue LEDs 102B (still referred to generally or collectively as LEDs 102). Such an arrangement can enable use of the LED array 200 as a color display.

The individual LEDs (pixels) in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

Figures 2E, 2F:
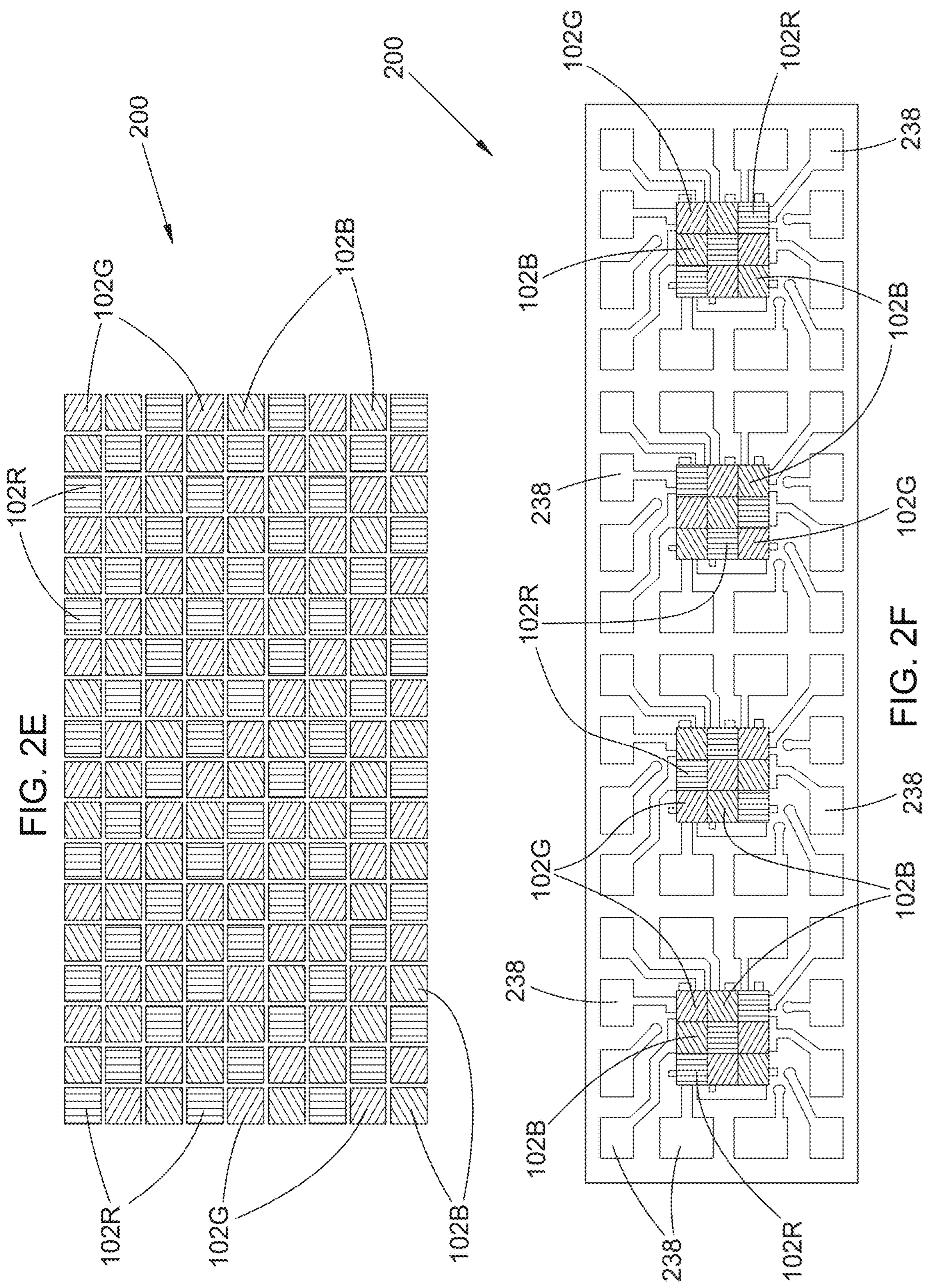
FIG. 2E is a schematic top view of a portion of an example LED display in which each display pixel is a red, green, or blue LED pixel.
FIG. 2F is a schematic top view of a portion of an example LED display in which each display pixel includes multiple LED subpixels (red, green, and blue) integrated onto a single die that is bonded to a control circuit backplane.

FIGS. 2E and 2F are examples of LED arrays 200 employed in display applications or visualization systems (e.g., augmented- or virtual-reality systems), wherein an LED display includes a multitude of display pixels. In some examples (e.g., as in FIG. 2E), each display pixel comprises a single semiconductor LED pixel 102R, 102G, or 102B of a single color (red, green, or blue). Each display pixel only provides one of the three colors. In some examples (e.g., as in FIG. 2F), each display pixel includes multiple semiconductor LED pixels 102 of multiple colors (also referred to as subpixels). In the example shown each display pixel includes a 3×3 array of semiconductor pixels 102; three of those LED pixels are red LEDs 102R, three are green LEDs 102G, and three are blue LEDs 102B. Each display pixel can therefore produce any desired color combination within the color gamut encompassed by the LEDs 102 (discussed below). In the example shown the spatial arrangement of the different colored LED pixels 102 differs among the display pixels; in some examples (not shown) each display pixel can have the same arrangement of the different colored LED pixels 102.

Individual LEDs 100 may optionally incorporate or be arranged in combination with a lens or other optical element located adjacent to or disposed on an output surface of the LED or a the phosphor layer (if present). Such an optical element may be referred to as a "primary optical element" and may be of any suitable type of arrangement (e.g., conventional refractive or diffractive optical elements, or so-called nanostructured optical elements such as those disclosed in U.S. Pat. No. 11,327,283, U.S. Pub. No. 2020/0343416, U.S. Pub. No. 2020/0335661, U.S. Pub. No. 2021/0184081, U.S. Pub. No. 2022/0146079, or U.S. Pub. No. 2022/0393076, each of which is incorporated by reference in its entirety).

Figures 3A, 3B:
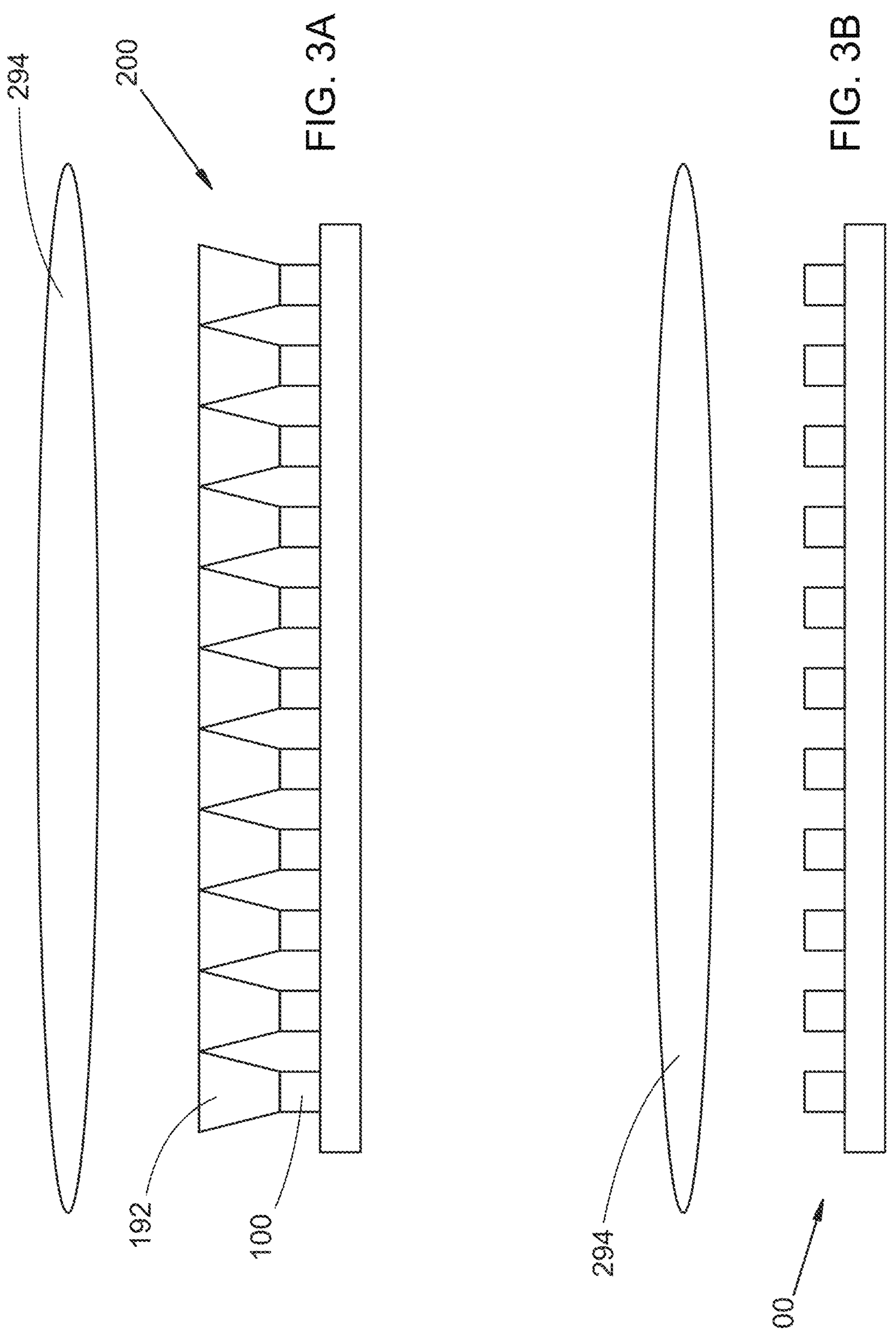
FIG. 3A shows a schematic cross-sectional view of an example array of LEDs arranged with respect to waveguides and a projection lens.
FIG. 3B shows an arrangement similar to that of FIG. 3A, but without the waveguides.

Instead or in addition, as shown in FIGS. 3A and 3B, an LED array 200 (for example, mounted on an electronics board) may be arranged in combination with secondary optical elements such as waveguides, lenses, or both for use in an intended application (for the entire array, for subsets thereof, or for individual pixels; of any suitable type or arrangement, e.g., conventional refractive or diffractive optical elements, or so-called nanostructured optical elements, including any of those listed above). In FIG. 3A, light emitted by each LED 100 of the array 200 is collected by a corresponding waveguide 192 and directed to a projection lens 294. Projection lens 294 may be a Fresnel lens, for example. This arrangement may be suitable for use, for example, in automobile headlights or other adaptive illumination sources. Other primary or secondary optical elements of any suitable type or arrangement can be included for each pixel, as needed or desired. In FIG. 3B, light emitted by LEDs of the array 200 is collected directly by projection lens 294 without use of intervening waveguides. This arrangement may particularly be suitable when LEDs can be spaced sufficiently close to each other, and may also be used in automobile headlights as well as in camera flash applications or other illumination sources. A miniLED or microLED display application may use similar optical arrangements to those depicted in FIGS. 3A and 3B, for example. In another example arrangement, a central block of LEDs in an array can be associated with a single common (shared) optic, while edge LEDs located in the array at the periphery of the central bloc can be each associated with a corresponding individual optic. Generally, any suitable arrangement of optical elements (primary, secondary, or both) can be used in combination with the LEDs described herein, depending on the desired application.

Figures 4A, 4B:
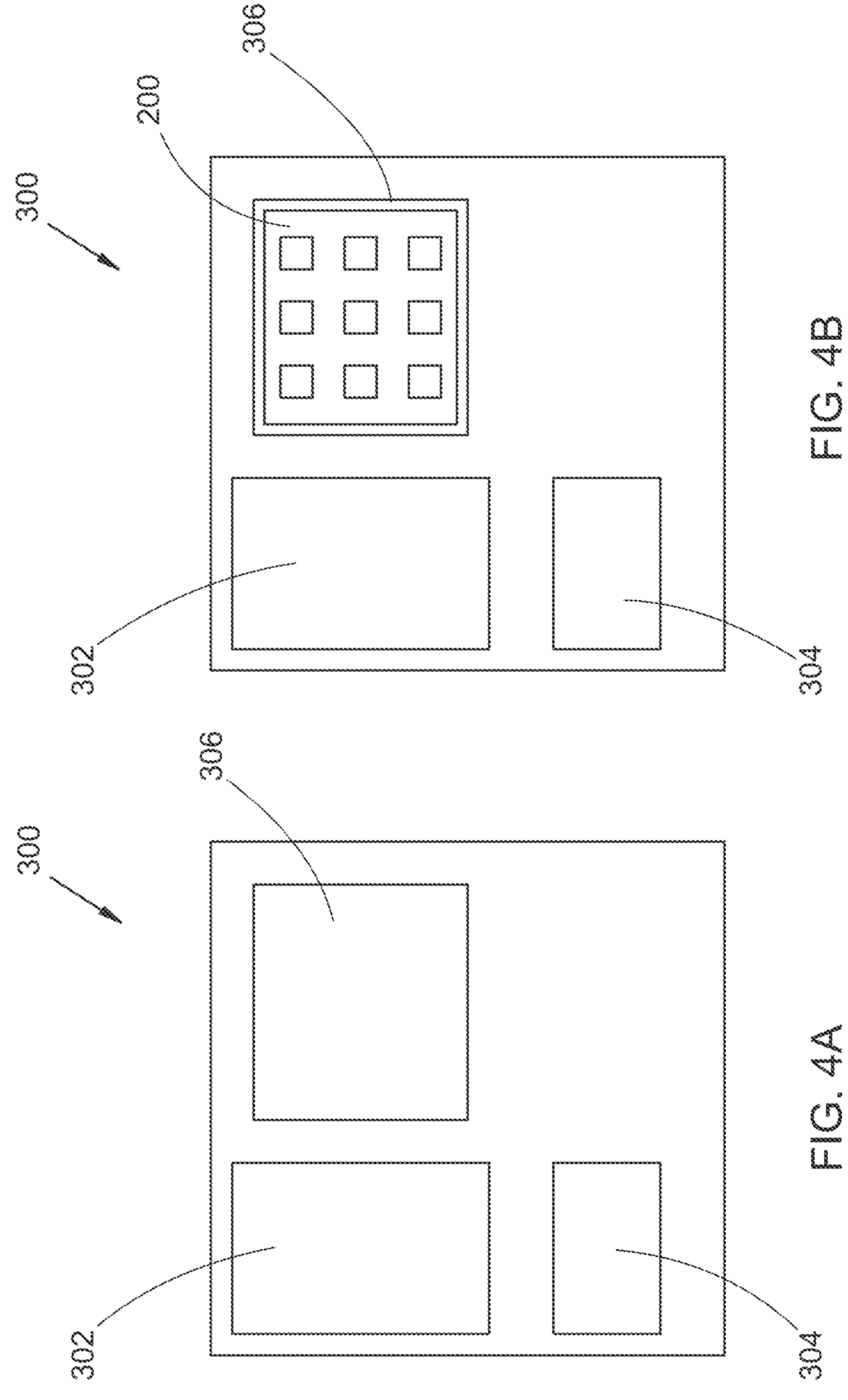
FIG. 4A shows a schematic top view an example electronics board on which an array of LEDs may be mounted, and FIG. 4B similarly shows an example array of LEDs mounted on the electronic board of FIG. 4A.

As shown in FIGS. 4A and 4B, a LED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, LED array 200 may be mounted on a separate board (not shown) from the power and control module and the sensor module.

An array of independently operable LEDs or pcLEDs may be used in combination with a lens, lens system, or other optic or optical system (e.g., as described above) to provide illumination that is adaptable for a particular purpose. For example, in operation such an adaptive lighting system may provide illumination that varies by color and/or intensity across an illuminated scene or object and/or is aimed in a desired direction. Beam focus or steering of light emitted by the LED or pcLED array can be performed electronically by activating LEDs or pcLEDs in groups of varying size or in sequence, to permit dynamic adjustment of the beam shape and/or direction without moving optics or changing the focus of the lens in the lighting apparatus. A controller can be configured to receive data indicating locations and color characteristics of objects or persons in a scene and based on that information control LEDs or pcLEDs in an array to provide illumination adapted to the scene. Such data can be provided for example by an image sensor, or optical (e.g., laser scanning) or non-optical (e.g., millimeter radar) sensors. Such adaptive illumination is increasingly important for automotive (e.g., adaptive headlights), mobile device camera (e.g., adaptive flash), AR, VR, and MR applications such as those described below.

Figure 5A:
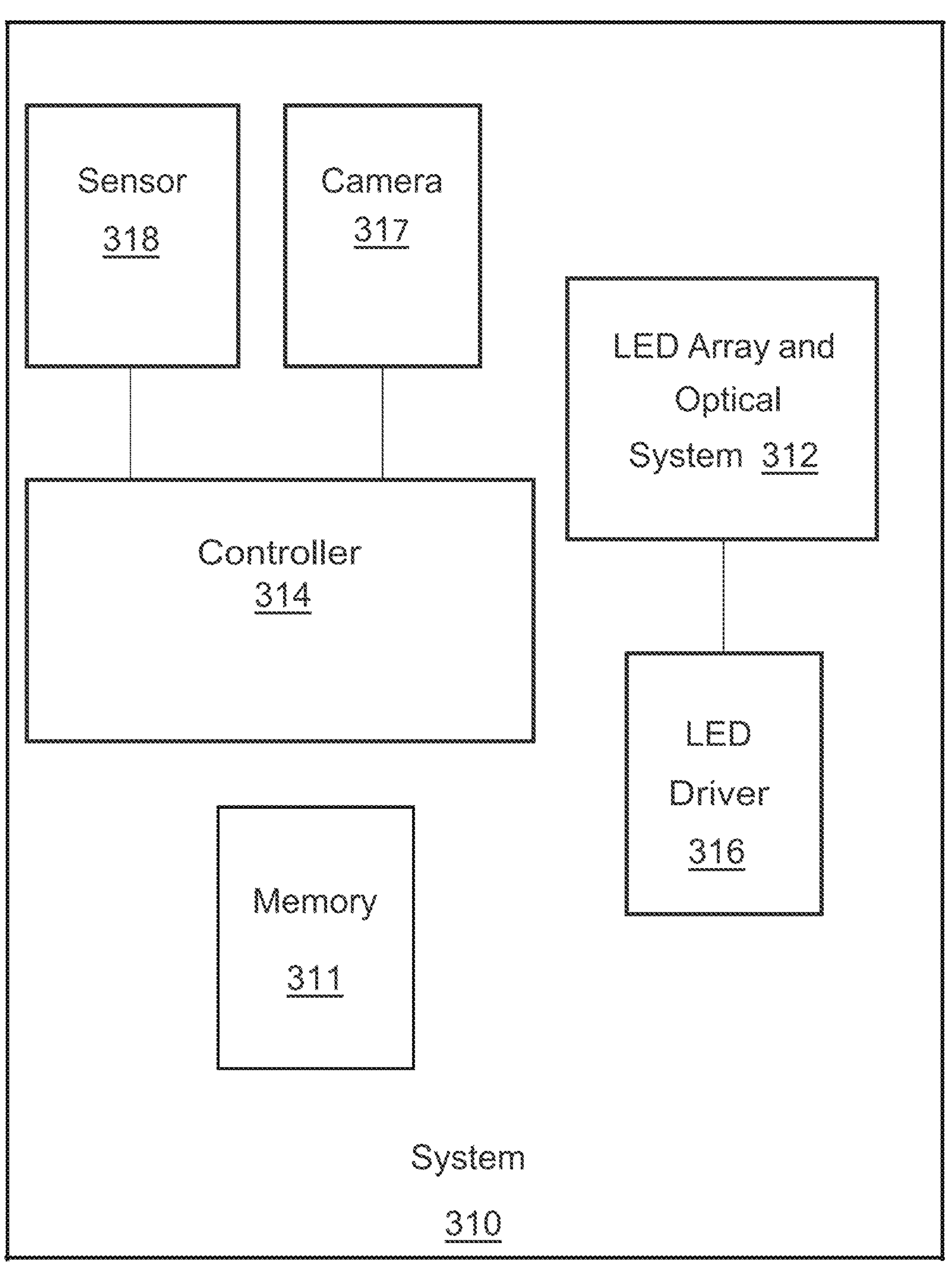
FIG. 5A schematically illustrates an example camera flash system.

FIG. 5A schematically illustrates an example camera flash system 310 comprising an LED or pcLED array and an optical (e.g., lens) system 312, which may be or comprise an adaptive lighting system as described above in which LEDs or pcLEDs in the array may be individually operable or operable as groups. In operation of the camera flash system, illumination from some or all of the LEDs or pcLEDs in array and optical system 312 may be adjusted—deactivated, operated at full intensity, or operated at an intermediate intensity. The array may be a monolithic array, or comprise one or more monolithic arrays, as described above. The array may be a microLED array, as described above.

Flash system 310 also comprises an LED driver 316 that is controlled by a controller 314, such as a microprocessor. Controller 314 may also be coupled to a camera 317 and to sensors 318 and operate in accordance with instructions and profiles stored in memory 311. Camera 317 and LED or pcLED array and lens system 312 may be controlled by controller 314 to, for example, match the illumination provided by system 312 (i.e., the field of view of the illumination system) to the field of view of camera 317, or to otherwise adapt the illumination provided by system 312 to the scene viewed by the camera as described above. Sensors 318 may include, for example, positional sensors (e.g., a gyroscope and/or accelerometer) and/or other sensors that may be used to determine the position and orientation of system 310.

Figure 5B:
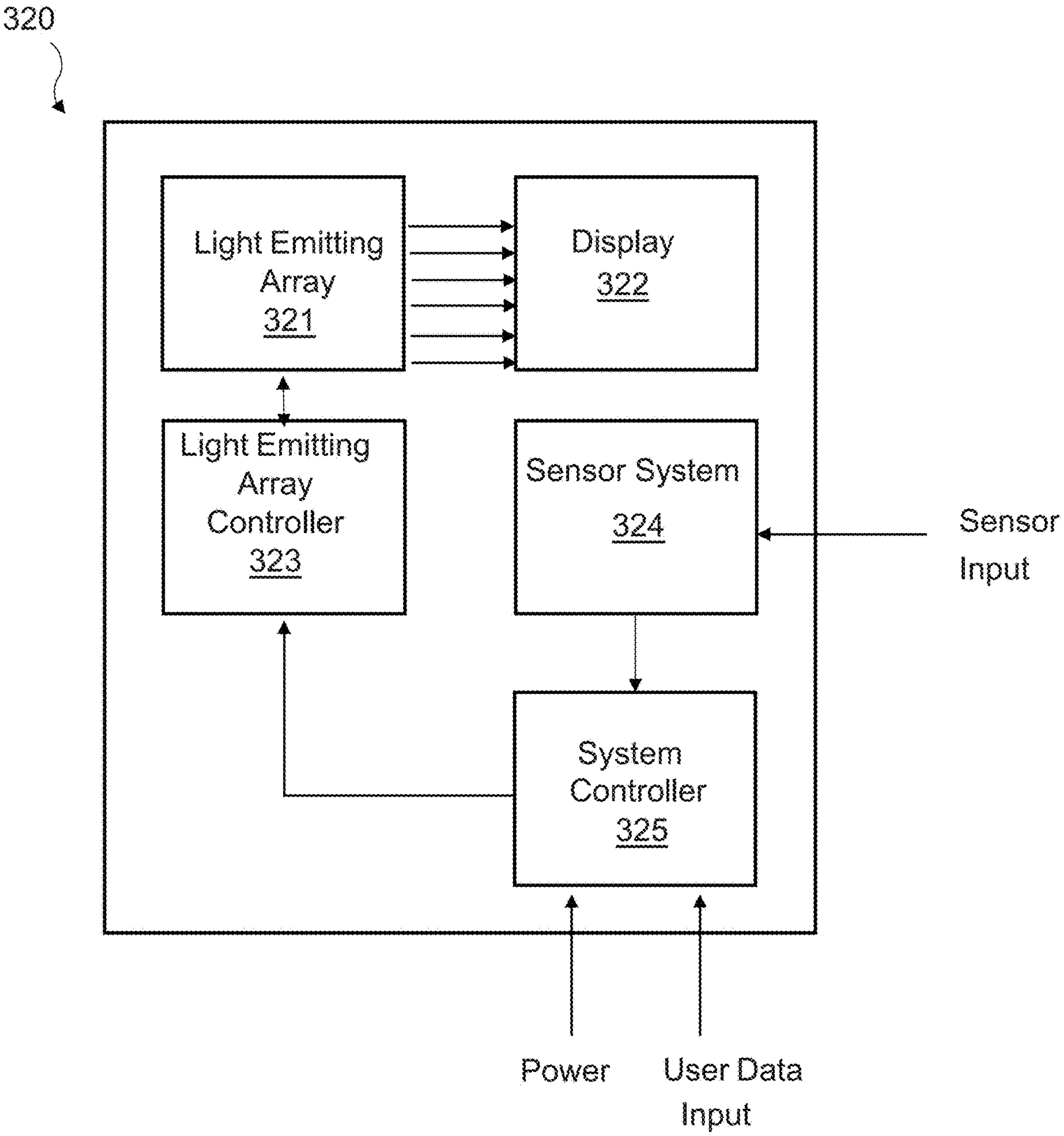
FIG. 5B schematically illustrates an example display system.

FIG. 5B schematically illustrates an example display system 320 that includes an array 321 of LEDs or pcLEDs that are individually operable or operable in groups, a display 322, a light emitting array controller 323, a sensor system 324, and a system controller 325. Array 321 may be a monolithic array, or comprise one or more monolithic arrays, as described above. The array may be monochromatic. Alternatively, the array may be a multicolor array in which different LEDs or pcLEDs in the array are configured to emit different colors of light, as described above. The array may therefore be or comprise a monolithic multicolor matrix of individually operable LED or pcLED light emitters, which may for example be microLEDs as described above. A single individually operable LED or pcLED or a group of adjacent such LEDs or pcLEDs in the array may correspond to a single pixel (picture element) in the display. For example, a group of three individually operable adjacent LEDs or pcLEDs comprising a red emitter, a blue emitter, and a green emitter may correspond to a single color-tunable pixel in the display. Similarly, to provide redundancy in the event of a defective LED or pcLED, a group of six individually operable adjacent LEDs or pcLEDs comprising two red emitters, two blue emitters, and two green emitters may correspond to a single color-tunable pixel in the display Array 321 can be used to project light in graphical or object patterns that can for example support AR/VR/MR systems.

Sensor input is provided to the sensor system 324, while power and user data input is provided to the system controller 325. In some embodiments modules included in system 320 can be compactly arranged in a single structure, or one or more elements can be separately mounted and connected via wireless or wired communication. For example, array 321, display 322, and sensor system 324 can be mounted on a headset or glasses, with the light emitting array controller and/or system controller 325 separately mounted.

System 320 can incorporate a wide range of optics (not shown) to couple light emitted by array 321 into display 322. Any suitable optics may be used for this purpose.

Sensor system 324 can include, for example, external sensors such as cameras, depth sensors, or audio sensors that monitor the environment, and internal sensors such as accelerometers or two or three axis gyroscopes that monitor an AR/VR/MR headset position. Other sensors can include but are not limited to air pressure, stress sensors, temperature sensors, or any other suitable sensors needed for local or remote environmental monitoring. In some embodiments, control input through the sensor system can include detected touch or taps, gestural input, or control based on headset or display position.

In response to data from sensor system 324, system controller 325 can send images or instructions to the light emitting array controller 323. Changes or modification to the images or instructions can also be made by user data input, or automated data input as needed. User data input can include but is not limited to that provided by audio instructions, haptic feedback, eye or pupil positioning, or connected keyboard, mouse, or game controller.

As noted above, AR, VR, and MR systems may be more generally referred to as examples of visualization systems. In a virtual reality system, a display can present to a user a view of scene, such as a three-dimensional scene. The user can move within the scene, such as by repositioning the user's head or by walking. The virtual reality system can detect the user's movement and alter the view of the scene to account for the movement. For example, as a user rotates the user's head, the system can present views of the scene that vary in view directions to match the user's gaze. In this manner, the virtual reality system can simulate a user's presence in the three-dimensional scene. Further, a virtual reality system can receive tactile sensory input, such as from wearable position sensors, and can optionally provide tactile feedback to the user.

In an augmented reality system, the display can incorporate elements from the user's surroundings into the view of the scene. For example, the augmented reality system can add textual captions and/or visual elements to a view of the user's surroundings. For example, a retailer can use an augmented reality system to show a user what a piece of furniture would look like in a room of the user's home, by incorporating a visualization of the piece of furniture over a captured image of the user's surroundings. As the user moves around the user's room, the visualization accounts for the user's motion and alters the visualization of the furniture in a manner consistent with the motion. For example, the augmented reality system can position a virtual chair in a room. The user can stand in the room on a front side of the virtual chair location to view the front side of the chair. The user can move in the room to an area behind the virtual chair location to view a back side of the chair. In this manner, the augmented reality system can add elements to a dynamic view of the user's surroundings.

Figure 5C:
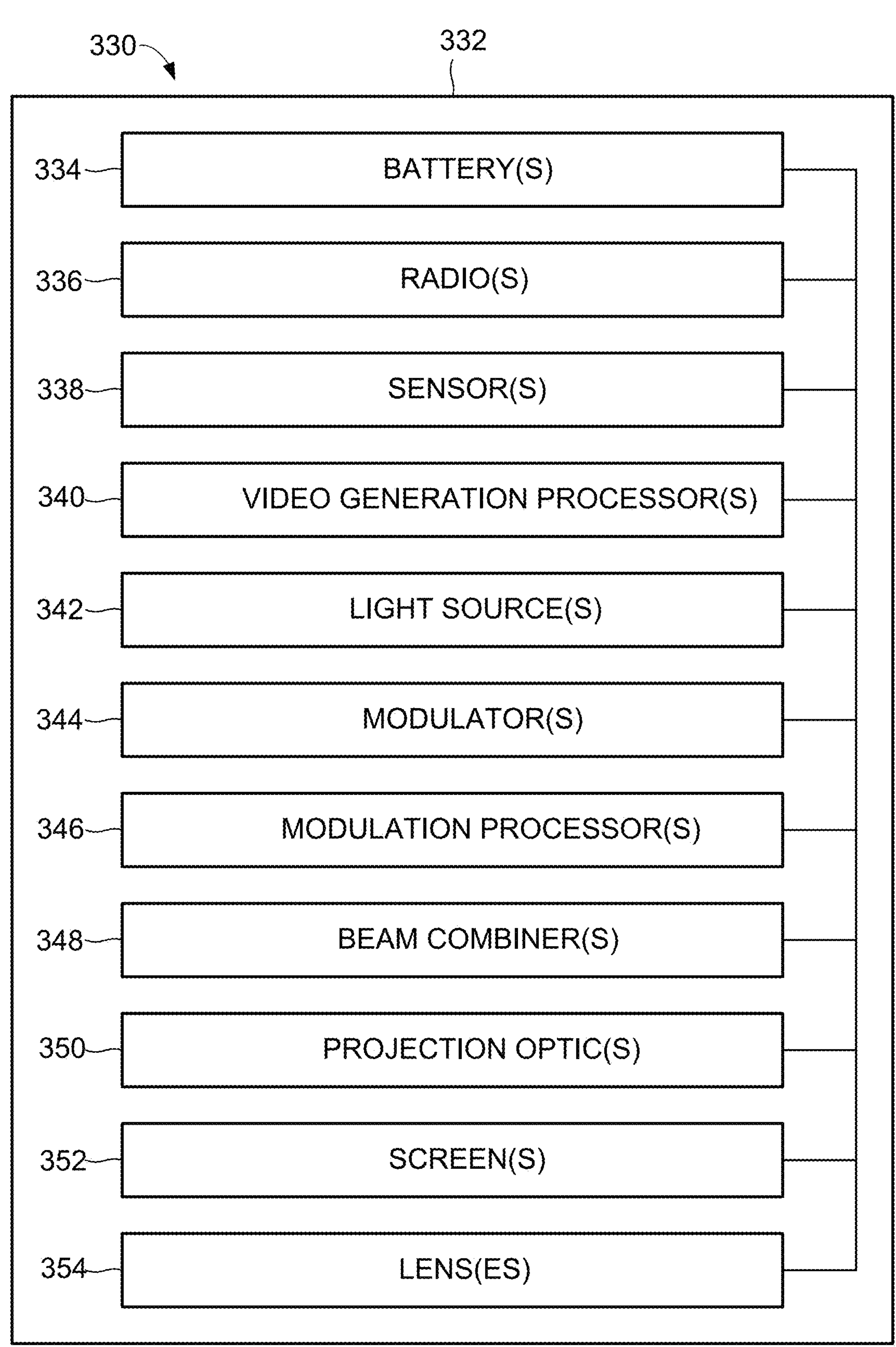
FIG. 5C shows a block diagram of an example visualization system.

FIG. 5C shows a generalized block diagram of an example visualization system 330. The visualization system 330 can include a wearable housing 332, such as a headset or goggles. The housing 332 can mechanically support and house the elements detailed below. In some examples, one or more of the elements detailed below can be included in one or more additional housings that can be separate from the wearable housing 332 and couplable to the wearable housing 332 wirelessly and/or via a wired connection. For example, a separate housing can reduce the weight of wearable goggles, such as by including batteries, radios, and other elements. The housing 332 can include one or more batteries 334, which can electrically power any or all of the elements detailed below. The housing 332 can include circuitry that can electrically couple to an external power supply, such as a wall outlet, to recharge the batteries 334. The housing 332 can include one or more radios 336 to communicate wirelessly with a server or network via a suitable protocol, such as WiFi.

The visualization system 330 can include one or more sensors 338, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 338 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an augmented reality system, one or more of the sensors 338 can capture a real-time video image of the surroundings proximate a user.

The visualization system 330 can include one or more video generation processors 340. The one or more video generation processors 340 can receive, from a server and/or a storage medium, scene data that represents a three-dimensional scene, such as a set of position coordinates for objects in the scene or a depth map of the scene. The one or more video generation processors 340 can receive one or more sensor signals from the one or more sensors 338. In response to the scene data, which represents the surroundings, and at least one sensor signal, which represents the location and/or orientation of the user with respect to the surroundings, the one or more video generation processors 340 can generate at least one video signal that corresponds to a view of the scene. In some examples, the one or more video generation processors 340 can generate two video signals, one for each eye of the user, that represent a view of the scene from a point of view of the left eye and the right eye of the user, respectively. In some examples, the one or more video generation processors 340 can generate more than two video signals and combine the video signals to provide one video signal for both eyes, two video signals for the two eyes, or other combinations.

The visualization system 330 can include one or more light sources 342 that can provide light for a display of the visualization system 330. Suitable light sources 342 can include any of the LEDs, pcLEDs, LED arrays, and pcLED arrays discussed above, for example those discussed above with respect to display system 320.

The visualization system 330 can include one or more modulators 344. The modulators 344 can be implemented in one of at least two configurations.

In a first configuration, the modulators 344 can include circuitry that can modulate the light sources 342 directly. For example, the light sources 342 can include an array of light-emitting diodes, and the modulators 344 can directly modulate the electrical power, electrical voltage, and/or electrical current directed to each light-emitting diode in the array to form modulated light. The modulation can be performed in an analog manner and/or a digital manner. In some examples, the light sources 342 can include an array of red light-emitting diodes, an array of green light-emitting diodes, and an array of blue light-emitting diodes, and the modulators 344 can directly modulate the red light-emitting diodes, the green light-emitting diodes, and the blue light-emitting diodes to form the modulated light to produce a specified image.

In a second configuration, the modulators 344 can include a modulation panel, such as a liquid crystal panel. The light sources 342 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 344 can include multiple modulation panels that can modulate different colors of light. For example, the modulators 344 can include a red modulation panel that can attenuate red light from a red light source such as a red light-emitting diode, a green modulation panel that can attenuate green light from a green light source such as a green light-emitting diode, and a blue modulation panel that can attenuate blue light from a blue light source such as a blue light-emitting diode.

In some examples of the second configuration, the modulators 344 can receive uniform white light or nearly uniform white light from a white light source, such as a white-light light-emitting diode. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 330 can include one or more modulation processors 346, which can receive a video signal, such as from the one or more video generation processors 340, and, in response, can produce an electrical modulation signal. For configurations in which the modulators 344 directly modulate the light sources 342, the electrical modulation signal can drive the light sources 344. For configurations in which the modulators 344 include a modulation panel, the electrical modulation signal can drive the modulation panel.

The visualization system 330 can include one or more beam combiners 348 (also known as beam splitters 348), which can combine light beams of different colors to form a single multi-color beam. For configurations in which the light sources 342 can include multiple light-emitting diodes of different colors, the visualization system 330 can include one or more wavelength-sensitive (e.g., dichroic) beam splitters 348 that can combine the light of different colors to form a single multi-color beam.

The visualization system 330 can direct the modulated light toward the eyes of the viewer in one of at least two configurations. In a first configuration, the visualization system 330 can function as a projector, and can include suitable projection optics 350 that can project the modulated light onto one or more screens 352. The screens 352 can be located a suitable distance from an eye of the user. The visualization system 330 can optionally include one or more lenses 354 that can locate a virtual image of a screen 352 at a suitable distance from the eye, such as a close-focus distance, such as 500 mm, 750 mm, or another suitable distance. In some examples, the visualization system 330 can include a single screen 352, such that the modulated light can be directed toward both eyes of the user. In some examples, the visualization system 330 can include two screens 352, such that the modulated light from each screen 352 can be directed toward a respective eye of the user. In some examples, the visualization system 330 can include more than two screens 352. In a second configuration, the visualization system 330 can direct the modulated light directly into one or both eyes of a viewer. For example, the projection optics 350 can form an image on a retina of an eye of the user, or an image on each retina of the two eyes of the user.

For some configurations of augmented reality systems, the visualization system 330 can include an at least partially transparent display, such that a user can view the user's surroundings through the display. For such configurations, the augmented reality system can produce modulated light that corresponds to the augmentation of the surroundings, rather than the surroundings itself. For example, in the example of a retailer showing a chair, the augmented reality system can direct modulated light, corresponding to the chair but not the rest of the room, toward a screen or toward an eye of a user.

For purposes of the present disclosure and appended claims, any arrangement of a layer, surface, substrate, diode structure, or other structure "on," "over," or "against" another such structure shall encompass arrangements with direct contact between the two structures as well as arrangements including some intervening structure between them. Conversely, any arrangement of a layer, surface, substrate, diode structure, or other structure "directly on," "directly over," or "directly against" another such structure shall encompass only arrangements with direct contact between the two structures. For purposes of the present disclosure and appended claims, a layer, structure, or material described as "transparent" or "substantially transparent" shall exhibit, at the nominal emission vacuum wavelength $\lambda_0$, a level of optical transmission that is sufficiently high, or a level of optical loss (due to absorption, scattering, or other loss mechanism) that is sufficiently low, that the light-emitting device can function within operationally acceptable parameters (e.g., output power or luminance, conversion or extraction efficiency, or other figures-of-merit including those described below).

In any of the arrangements described hereinabove, the range of colors in the CIE 1931 chromaticity diagram that can be achieved by the red, green, and blue LEDs (i.e., the color gamut) is a triangular area of within the chromaticity diagram defined by the corresponding color points of the red, green, and blue LEDs. In some examples it may be desirable form the color gamut provided by the red, green, and blue LEDs to encompass some specific selected color gamut. In some examples the selected color gamut can be the sRGB color gamut, defined by the points (0.64, 0.33), (0.03, 0.60), and (0.15, 0.06); in other examples a different selected color gamut can be employed.

Commonly employed red, green, and blue direct-emitting semiconductor LEDs frequently include III-nitride semiconductor materials, as noted above. InGaN-based semiconductor materials are often employed. Those materials can exhibit relatively broad emission spectra (e.g., full width at half maximum (FWHM) from 30 nm to over 70 nm), which can make it difficult to achieve a desired color point in red regions of the optical spectrum, where the responsivity of the human eye is comparatively weak. The broad spectrum means that the red LED emission spectrum of a nominally red LED might have a significant "tail" in the orange or yellow/orange region of the spectrum. That spectral tail, and the higher responsivity of the human eye in central regions of the visible spectrum, can make it difficult to achieve a sufficiently long dominant wavelength for a nominally red LED. It would be desirable to alter the dominant wavelength of red InGaN-based LEDs to enable a set of red, green, and blue LEDs, that includes red InGaN-based LEDs, to encompass a desired color gamut, e.g., the sRGB gamut.

Examples of inventive light-emitting device are illustrated schematically in FIGS. 6A-6C and FIG. 7. Such devices include one or more red InGaN-based light-emitting diodes (LEDs) 502R, one or more green III-nitride-based LEDs 502G, one or more blue III-nitride-based LEDs 502B, and one or more spectrally selective optical elements 510 (e.g., as in FIGS. 6A-6C) or 511/512 (e.g., as in FIG. 7). The LEDs can be referred to collectively, or without color specificity, as LEDs 502. Corresponding electrical drive currents are applied to the LEDs 502, which in response emit light from corresponding junctions or active layers thereof. The junction or active layer of each red LED 502R is arranged to emit red emitted light 99R, characterized by a red emitted color point; the junction or active layer of each green LED 502G is arranged to emit green emitted light 99G, characterized by a green emitted color point; the junction or active layer of each blue LED 502B is arranged to emit blue emitted light 99B, characterized by a blue emitted color point.

The one or more spectrally selective optical elements 510 or 511/512 are positioned and arranged so that (i) at least the red emitted light 99R is incident on one or more of the spectrally selective optical elements, and (ii) corresponding output portions of the red, green, or blue emitted light exit the device as red output light 98R characterized by a red output color point, green output light 98G characterized by a green output color point, and blue output light 98B characterized by a blue output color point, respectively.

In some examples the red LEDs 502R exhibit an optical spectrum with a significant portion extending to shorter wavelengths, or an optical spectrum that shifts to shorter wavelengths with increasing drive current. In both cases, the dominant wavelength of the red emitted color point can be shifted into in the orange or orange/yellow regions of the optical spectrum (e.g., a red emitted dominant wavelength less than 610 nm). In such examples, some or all of the spectrally selective optical elements 510 or 511 can be arranged so that, over some or all of corresponding operational ranges of the corresponding electrical drive currents applied to the red LEDs 502R, the dominant wavelength the red output color point remains in the red regions of the optical spectrum (e.g., a red dominant wavelength greater than 610 nm), Note that the dominant wavelength is defined in the standard way, i.e., the point where a line on the CIE 1931 chromaticity diagram from the white color point (x=⅓ and y=⅓) through the color point then intersects the monochromatic locus.

In some examples one or both of the green or blue LEDs 502 can comprise InGaN-based LEDs. III-nitride semiconductor LEDs, and InGaN-based LEDs in particular, can in some instances exhibit relatively wide emission spectra. In some examples the red emitted light 99R can be characterized by spectral bandwidth (FWHM) of the red emitted spectrum 89R that is greater than 30 nm, greater than 40 nm, greater than 50 nm, greater than 60 nm, or greater than 70 nm.

Figures 8A, 8B:
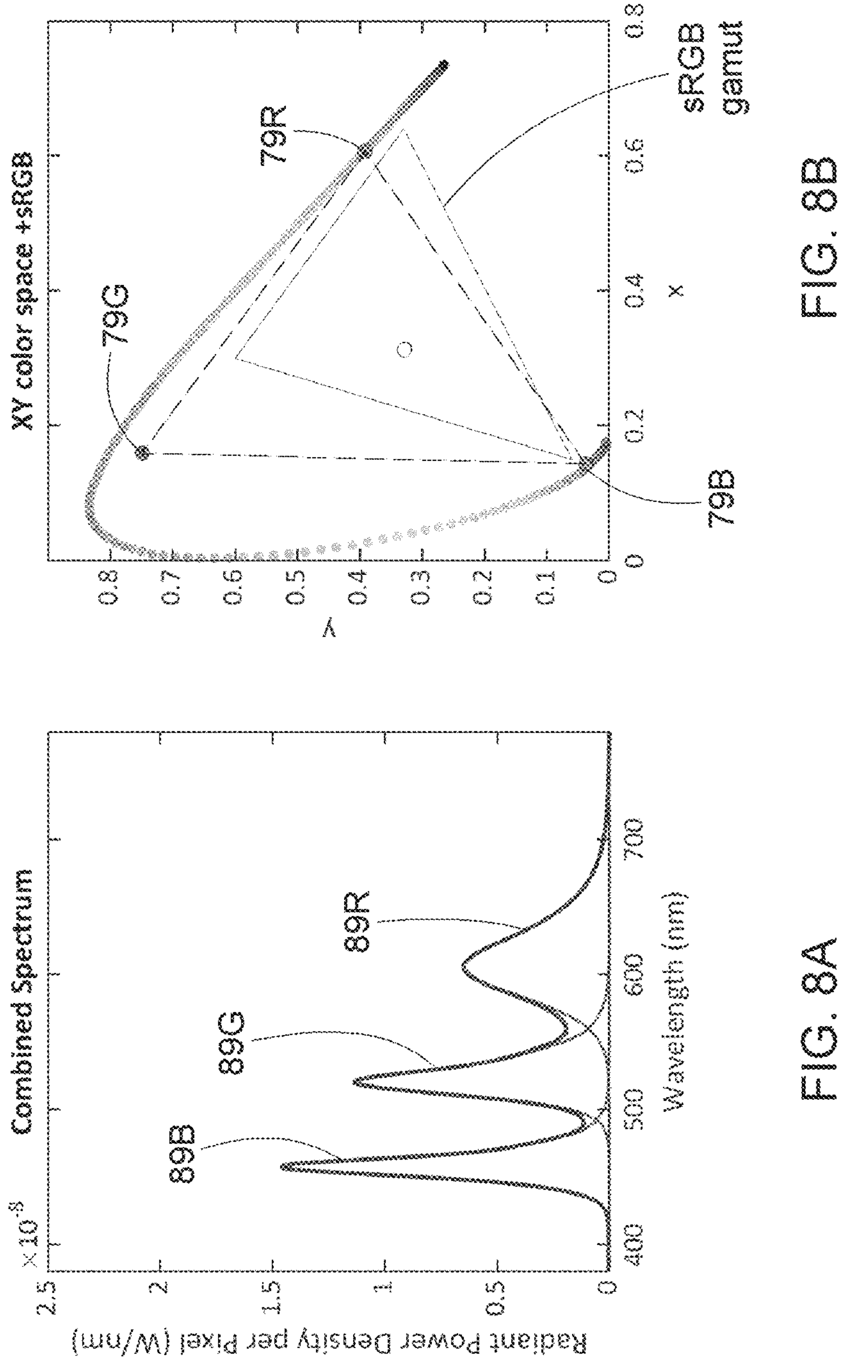
FIGS. 8A and 8B show optical spectra and color points of red emitted light, green emitted light, and blue emitted light from red, green, and blue InGaN-based LEDs operated at relatively high power without any spectrally selective optical element.

In some examples the red, green, and blue LEDs are intended to produce output light over a range of different colors based on differing relative outputs of the LEDs. Examples are illustrated in FIGS. 8A/8B, 9A/9B, and 10A/10B. The red emitted light 99R is characterized by red emitted spectrum 89R and a red emitted color point 79R; the green emitted light 99G is characterized by green emitted spectrum 89G and a green emitted color point 79G; the blue emitted light 99B is characterized by blue emitted spectrum 89B and a blue emitted color point 79B. The red output light 98R is characterized by red output spectrum 88R and a red output color point 78R; the green output light 98G is characterized by green output spectrum 88G and a green output color point 78G; the blue output light 98B is characterized by blue output spectrum 88B and a blue output color point 78B.

Figures 10A, 10B:
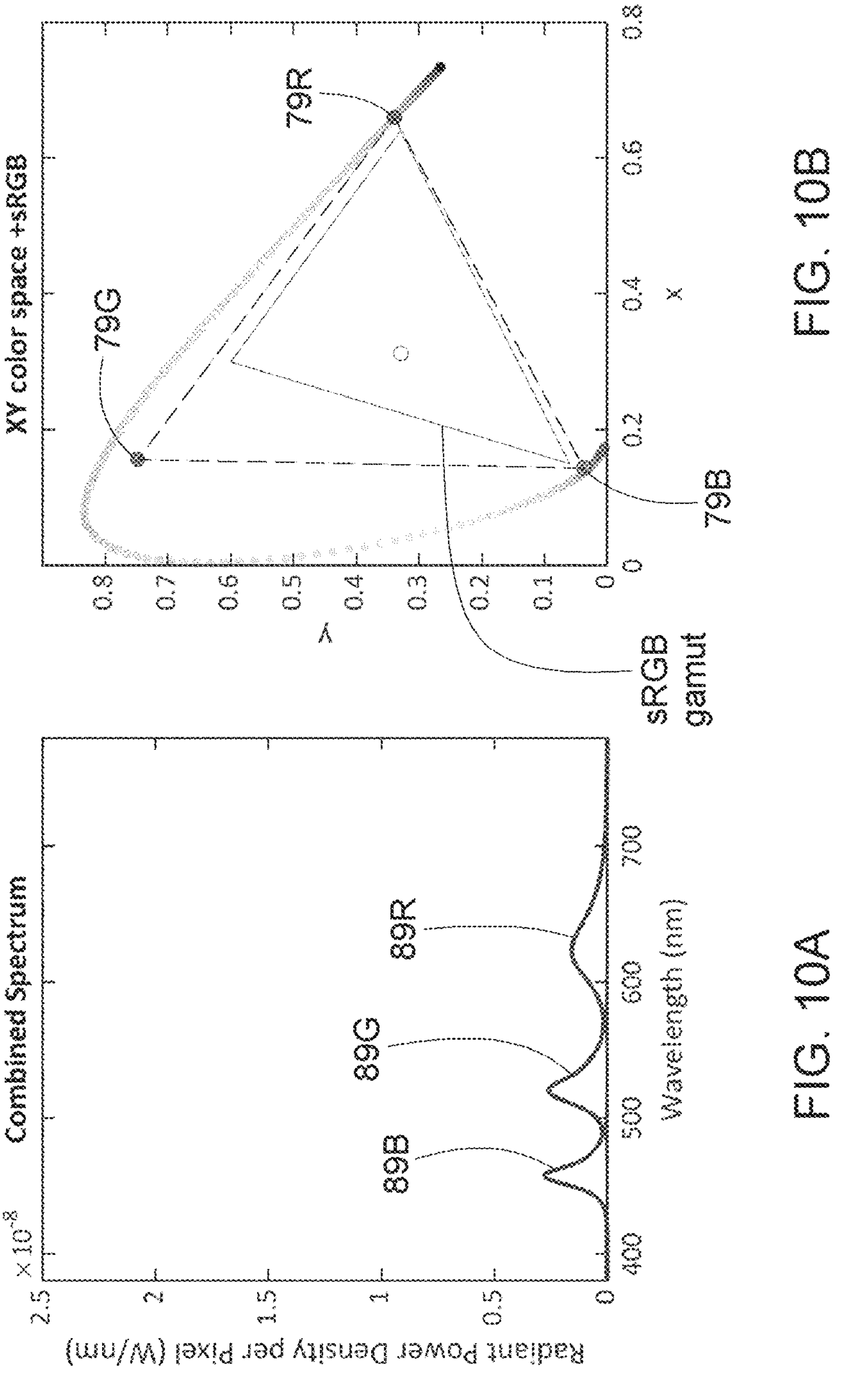
FIGS. 10A and 10B show optical spectra and color points of red emitted light, green emitted light, and blue emitted light from red, green, and blue InGaN-based LEDs operated at relatively low power without a spectrally selective optical element.

In some examples it is desired for the red, green, and blue color points to define a color gamut in the chromaticity diagram that encompasses a desired region of the diagram; in some examples the desired region is the sRGB color gamut, defined by red, green, and blue color points (0.64, 0.33), (0.30, 0.60), and (0.15, 0.06), respectively. In some instances, the emitted color points 79R/79B/79G might encompass the sRGB color gamut, e.g., as in the relatively low-power, operation illustrated in FIGS. 10A/10B (without any spectrally selective elements 510 or 511/512). Driving those LEDs at higher power, however, can in some instances lead to the behavior shown in FIG. 8A/8B. At higher power the emitted spectrum 89R and color point 79R of the red emitted light 99R have shifted to shorter wavelengths, and the resulting color gamut fails to encompass the sRGB gamut. In some examples the LEDs 502 might fail to encompass the sRGB gamut even when driven at low power.

Figures 9A, 9B:
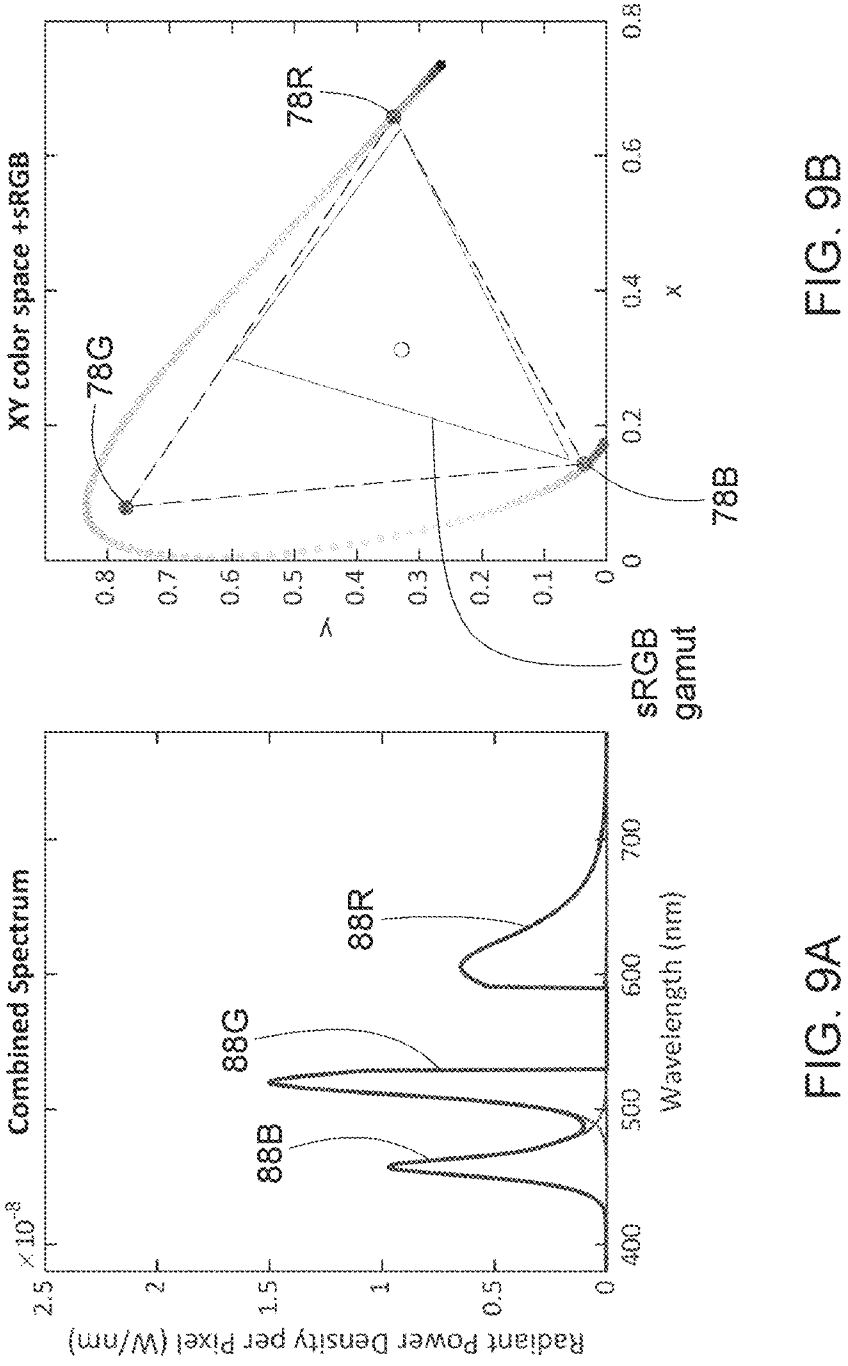
FIGS. 9A and 9B show optical spectra and color points of red output light, green output light, and blue output light from red, green, and blue InGaN-based LEDs operated with a spectrally selective optical element.

The spectrally selective optical elements 510 or 511/512 can be arranged so that the output color points 78R/78G/78B of the red output light 98R, the green output light 98G, and the blue output light 98B define a color gamut that does encompasses the sRGB color gamut (e.g., as in FIGS. 9A/9B). The red, green, and blue output spectra 88R/88G/88B shown in FIG. 9A, resulting from the spectrally selective elements 510 or 511/512, show that a short-wavelength portion of the red emitted spectrum 89R is reduced or eliminated from the red output spectrum 88R, and the corresponding red output color point 78R is shifted to a longer dominant wavelength relative to the red emitted color point 79R. In the example shown a small portion of the green emitted light 99G is also blocked, but that results in no or only a negligible shift in the green dominant wavelength or color point. In examples wherein there is a shift to shorter wavelengths with increasing output power from the red LEDs 502R, the spectrally selective elements 510 or 511/512 enable the entire sRGB gamut to be encompassed over the entire range of output power, despite the shift with increasing power.

In some examples, the shift of color points with output power describe above is observed, and the spectrally selective elements 510 or 511/512 can maintain the desired color gamut over the entire operational range of output power, even if not needed at lower output powers. In some examples, the emitted color points 79R/79G/79B might fail to encompass the desired gamut (e.g., the sRGB gamut) over their entire operational range of output powers. In such examples the spectrally selective elements 510 or 511/512 can shift the output color points 78R/78G/78B to encompass the desired color gamut over the entire operation range of output power.

In some examples, including those shown, the spectrally selective elements 510 or 511/512 can alter the red dominant wavelength so that $\lambda_{RO}$ is greater than ARE (e.g., so that $\lambda_{RO}$ is greater than 610 nm and ARE is less than 610 nm). In some of those examples, one or both of the green or blue dominant wavelengths can remain unchanged (e.g., so that $\lambda_{GO}=\lambda_{GE}$ and/or $\lambda_{BO}=\lambda_{BE}$). In some examples any one or two or all of the red, green, or blue dominant wavelengths can be altered by the spectrally selective elements 510 or 511/512.

The one or more spectrally selective optical elements 510 or 511/512 can be of any suitable type or arrangement. In some examples the spectrally selective optical elements can include one or more notch or long-pass optical filters arranged so as to reduce or eliminate transmission of a short-wavelength portion of the red emitted spectrum 89R, so as to reduce or eliminate that short-wavelength portion from the red output spectrum 88R.

In some examples, the red, green, and blue LEDs 502 can be arranged in a single layer as a two-dimensional array (e.g., as in the example arrangements of FIG. 2A-2F, 3A, 3B, or 6A) with the corresponding output surfaces of the red, green, and blue LEDs 502 forming an output surface of the array. In some of those examples, the spectrally selective optical elements 510 can comprise one or more continuous optical filtering layers positioned opposite output surfaces of the red, green, and blue LEDs 502 of the array (e.g., as in FIG. 6A). Because emitted light from all LEDs 502 must pass through the spectrally selective element 510, in some examples arranged as in FIG. 6A (or FIG. 6B or 6C), the element 510 can be arranged to only block a narrow band of wavelengths in the short-wavelength portion of the red output spectrum 89R (e.g., as in FIG. 9A). In that example the element 510 can be arranged as a notch filter, with a stop band sufficiently narrow so as not to alter the dominant wavelength or color point of the green LED light 99G/98G. In other examples in which the red, green, and blue LEDs 502 are arranged in a single layer as a two-dimensional array, the spectrally selective optical elements 510 can comprise multiple discrete optical filtering elements 510, with the discrete optical filtering elements 510 being positioned opposite corresponding output surfaces of at least the corresponding red LEDs 502 of the array. In such an arrangement, each filter need only be arranged for the emitted and output spectra of that color of LED. For example, to achieve the result shown in FIGS. 9A and 9B, long-pass optical filters with a suitably chosen cutoff wavelength can be positioned over each of the red LEDs 502R. The blue and green LEDS 502B and 502G can have different corresponding spectrally selective elements 510 (e.g., optical filters), or no elements 510 at all.

Figure 6A:
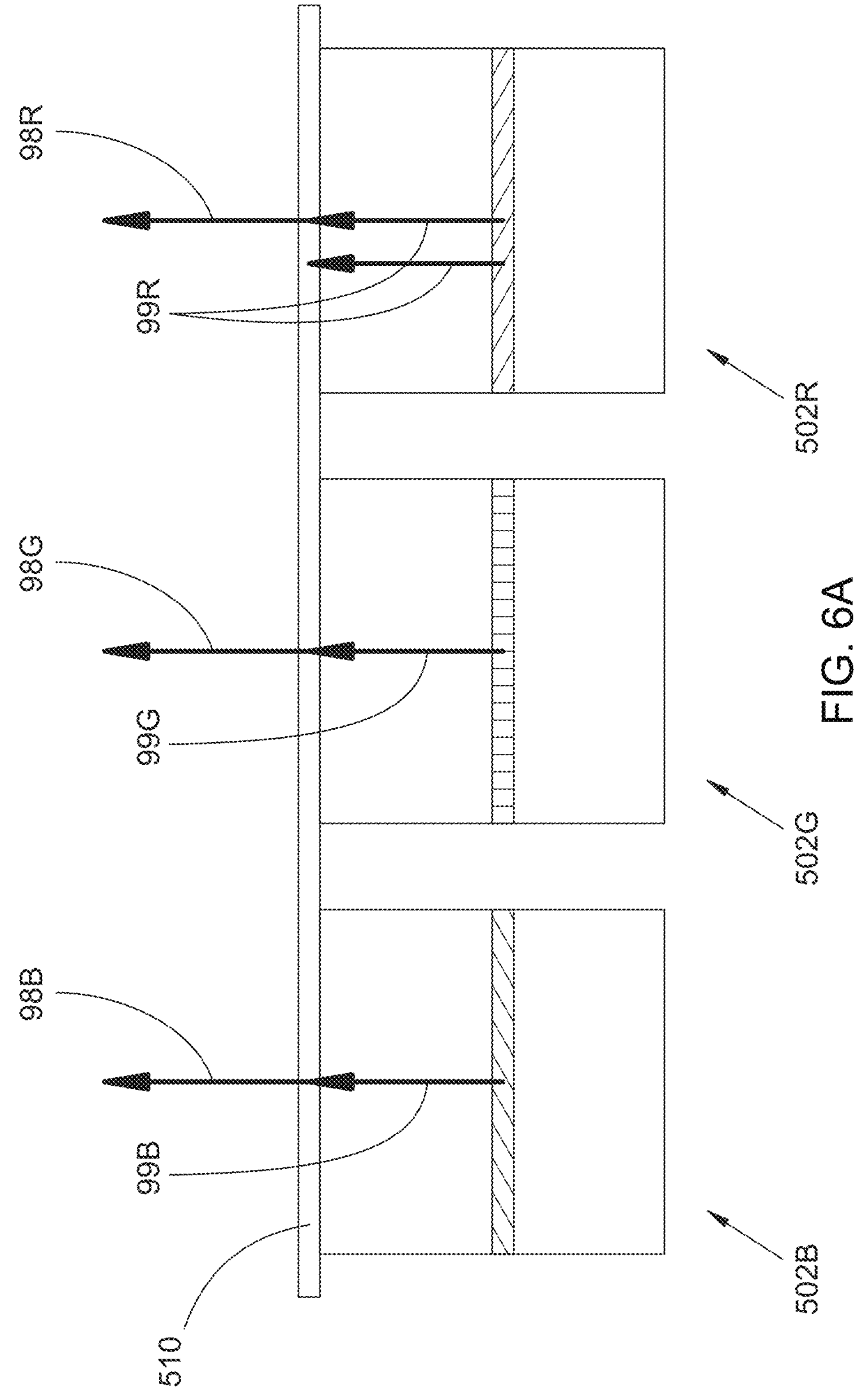
FIG. 6A is a schematic cross-sectional view of a portion of an array of red, green, and blue LEDs with a spectrally selective optical element.
Figure 6B:
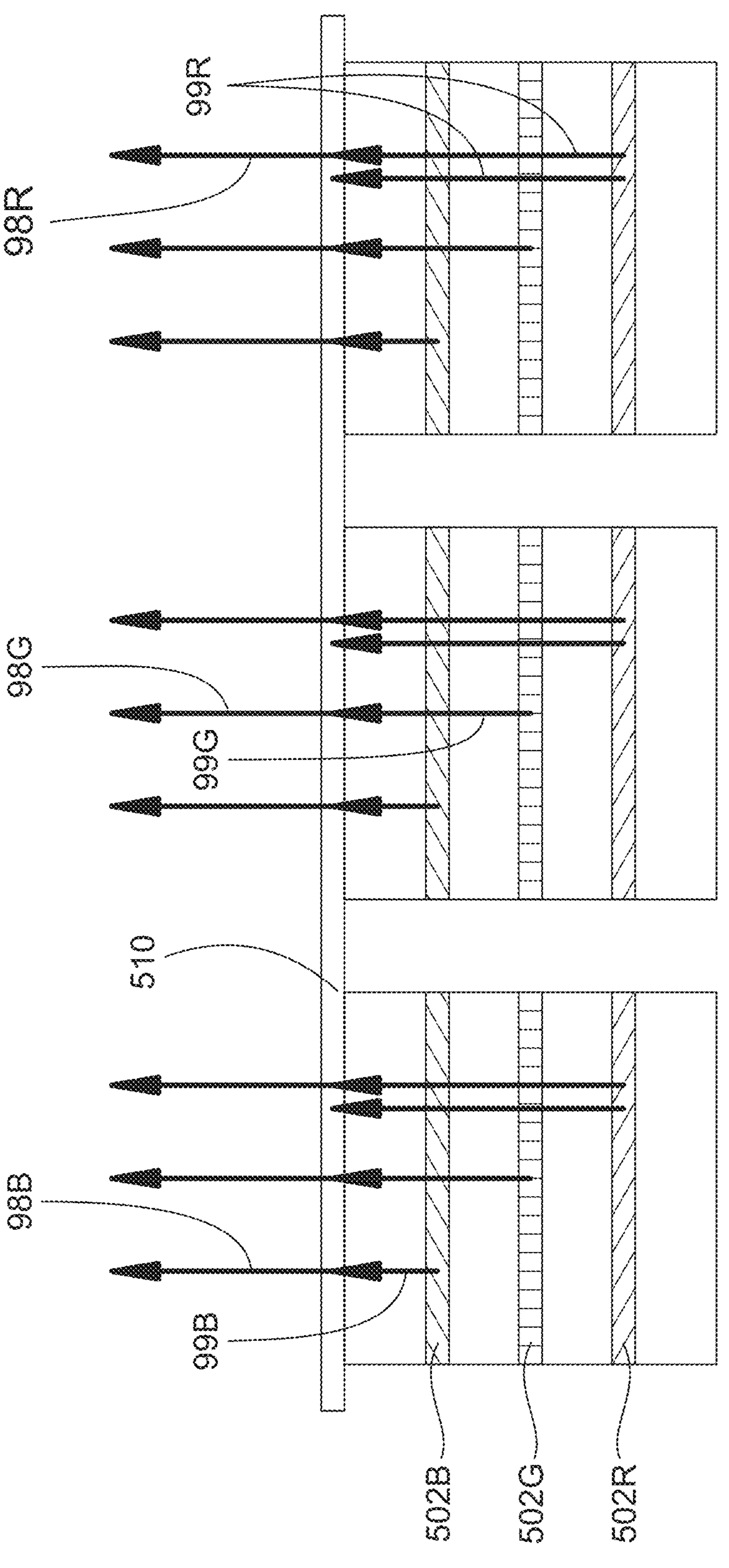
FIG. 6B is a schematic cross-sectional view of a portion of an array of stacked red, green, and blue LEDs with a spectrally selective optical element.
Figure 6C:
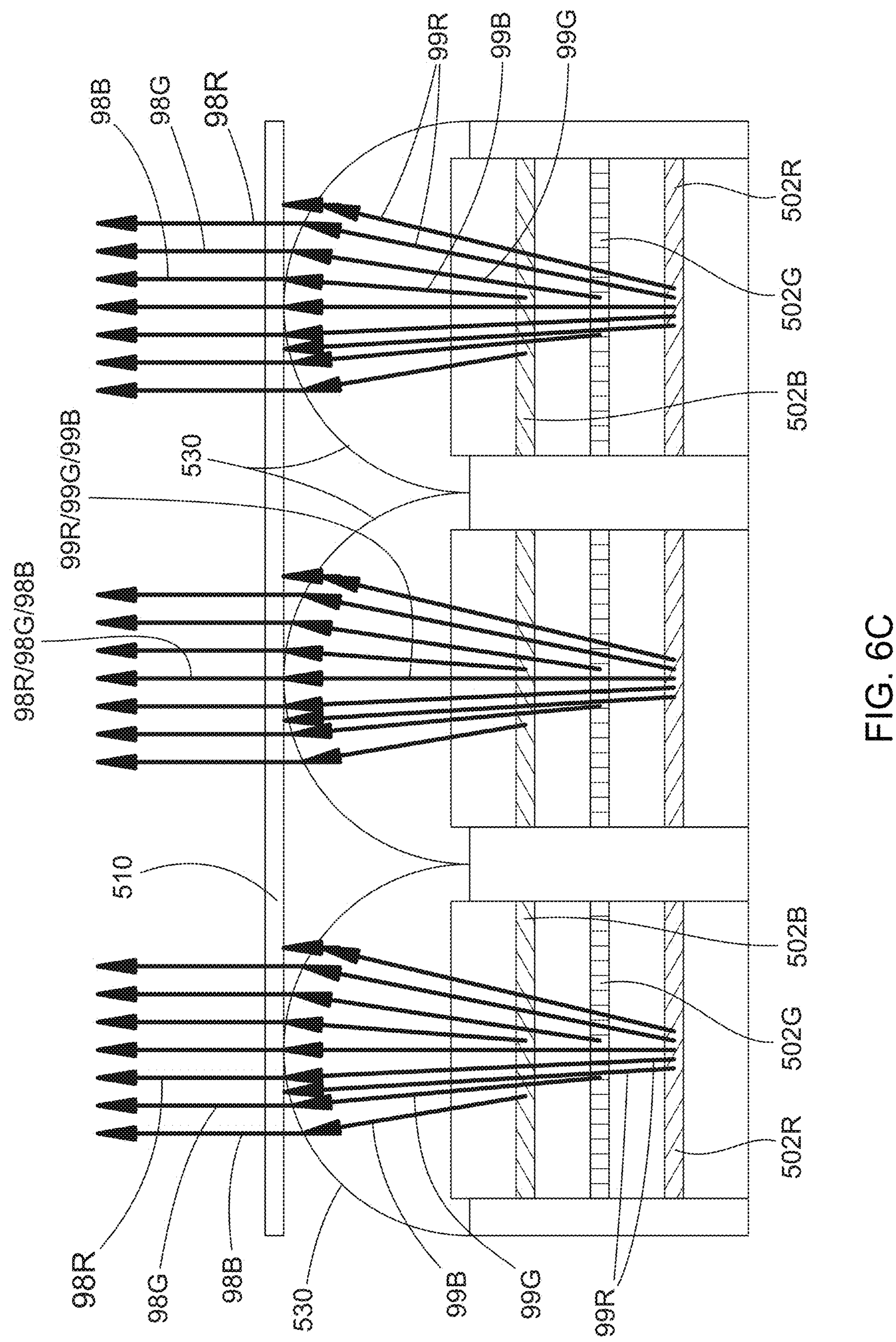
FIG. 6C is a schematic cross-sectional view of an array of red, green, and blue LEDs with primary optics and a spectrally selective optical element.

In some examples, the red, green, and blue LEDs 502 can be arranged in one or more LED stacks, e.g., as in FIGS. 6B-6D. Each LED stack can be arranged so that the red output light 98R, the green output light 98G, and the blue output light 98B propagate away from a corresponding output surface of that LED stack.

Figure 7:
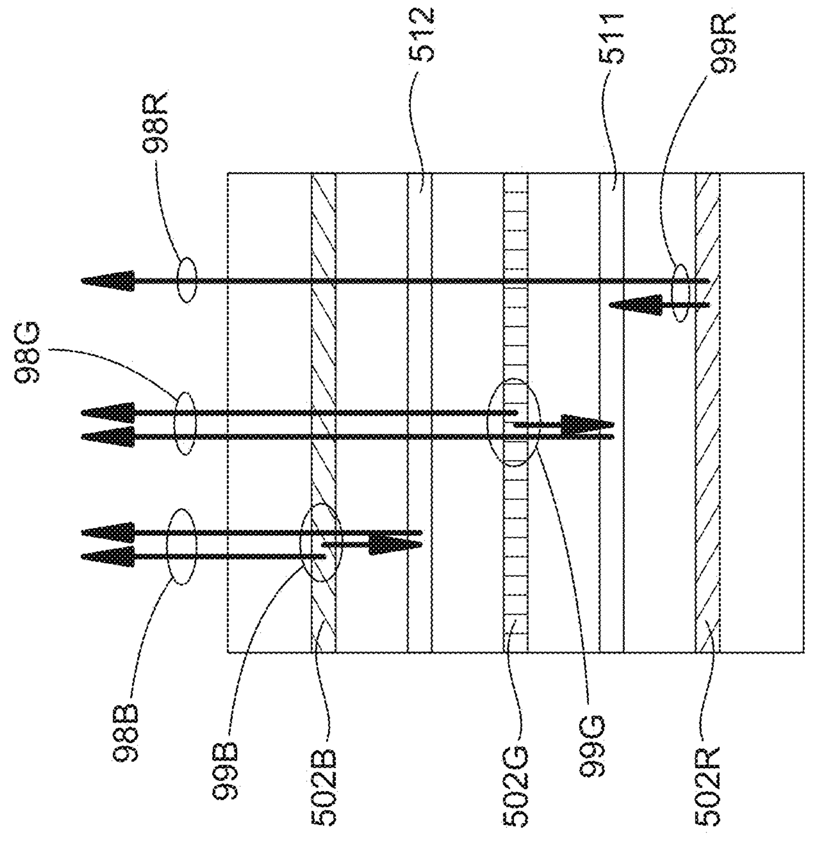
FIG. 7 is a schematic cross-sectional view of stacked red, green, and blue LEDs with integrated spectrally selective optical elements.

In some stacked examples, the spectrally selective optical element can include a notch or long-pass optical filter 511 positioned between the red LED 502R of each LED stack and the corresponding green LED 502G, blue LED 502B, and output surface of that LED stack (e.g., as in FIG. 7). That filter 511 can be arranged to reduce or eliminate transmission of a short-wavelength portion of an optical spectrum of the red emitted light 99R, to reduce or eliminate that short-wavelength portion from the red output light 98R. Instead or in addition, the filter 511 can be arranged to reduce or eliminate transmission of green emitted light 99G from the green LED 502G into the corresponding red LED 502R of each LED stack.

In some stacked examples, the spectrally selective optical element can include a notch or long-pass optical filter 512 positioned between the green and blue LEDs 502G/502B of each LED stack (e.g., as in FIG. 7). The filter 512 between the green and blue LEDs 502G/502B can be arranged to reduce or eliminate transmission of blue emitted light 99B from the blue LED 502B into the corresponding green LED 502G of each stack.

In some stacked examples, the LED stacks of red, green, and blue LEDs 502 can be arranged as a two-dimensional array (e.g., as in the example arrangements of FIG. 2A-2C, 3A, 3B, 6B, or 6C) with the corresponding output surfaces of the LED stacks forming an output surface of the array. In some stacked, arrayed examples, the spectrally selective optical elements 510 can comprise one or more continuous optical filtering layers positioned opposite output surfaces of the LED stacks of the array (e.g., as in FIGS. 6B and 6C), in any of the arrangements already described above. In some stacked, arrayed examples, the spectrally selective optical elements 510 can comprise multiple discrete optical filtering elements, the optical filtering elements being positioned opposite corresponding output surfaces of corresponding LED stacks of the array.

In some examples of either type of array (stacked or single layer), the light-emitting device can further comprise one or more primary optical elements positioned between corresponding output surfaces of the red, green, or blue LEDs 502 and the some or all of the spectrally selective optical elements 510. One such example is shown in FIG. 6C, with microlenses 530 being positioned between the LEDs 502 and the spectrally selective layer 510. In some examples of stacked or single-layer arrays, the light-emitting device can further comprise primary optical elements positioned over corresponding output surfaces of the red, green, or blue LEDs 502, with corresponding spectrally selective optical elements 510 being positioned between the primary optical element and the corresponding output surface.

The spectrally selective optical elements 510 or 511/512 can be of any suitable type or arrangement. In some examples, the spectrally selective optical elements 510 or 511/512 can include one or more absorptive optical elements that exhibit spectrally selective optical absorption. In some examples, the spectrally selective optical elements 510 or 511/512 can include one or more reflective optical elements that exhibit spectrally selective optical reflectivity (e.g., multilayer, interference-type long-pass, short-pass, or notch filters). In some examples (e.g., as in FIGS. 6A-6C), the spectrally selective optical elements 510 are positioned opposite corresponding output surfaces of corresponding red, green, or blue LEDs 502. In some examples, the one or more spectrally selective optical elements can form portions of corresponding electrodes of corresponding red, green, or blue LEDs 502, or can be positioned between the corresponding electrodes and the corresponding red, green, or blue LEDs 502. Examples of all of those arrangements are disclosed in co-owned published patent application US 2023/0138761, which is incorporated herein by reference in its entirety.

In some examples of either type of array (stacked or single layer), the light-emitting device can further comprise a control circuit connected to the array and arranged so as to enable independent operation of single LEDs or groups of LEDs of the array (e.g., as in FIG. 4A, 4B, 5A, or 5B). Such independent operation enables alteration of color of the light emitted by the array and/or alteration of data or imagery displayed by the array.

In addition to the preceding, the following example embodiments fall within the scope of the present disclosure or appended claims. Any given Example below that refers to multiple preceding Examples shall be understood to refer to only those preceding Examples with which the given Example is not inconsistent, and to exclude implicitly those preceding Examples with which the given Example is inconsistent.

Example 1. A light-emitting device comprising: (a) one or more red InGaN-based light-emitting diodes (LEDs) arranged to emit red emitted light; (b) one or more green III-nitride-based LEDs arranged to emit green emitted light; (c) one or more blue III-nitride-based LEDs arranged to emit blue emitted light; and (d) one or more spectrally selective optical elements positioned and arranged so that (i) at least the red emitted light is incident on one or more of the spectrally selective optical elements, and (ii) output portions of the red, green, and blue emitted light exit the device as red output light characterized by a red output color point, green output light characterized by a green output color point, and blue output light characterized by a blue color point, respectively, the red, green, and blue output color points defining an output color gamut that encompasses at least an sRGB color gamut.

Example 2. The light-emitting device of Example 1, (i) the red emitted light being characterized by a spectrum full width at half maximum greater than 30 nm, greater than 40 nm, greater than 50 nm, greater than 60 nm, or greater than 70 nm.

Example 3. The light-emitting device of any one of Examples 1 or 2, the one or more spectrally selective optical elements including one or more notch or long-pass optical filters arranged so as to reduce or eliminate transmission of a short-wavelength portion of an optical spectrum of the red emitted light, so as to reduce or eliminate that short-wavelength portion from the red output light.

Example 4. The light-emitting device of anyone of Examples 1 through 3 wherein (i) the red emitted light is characterized by a red emitted color point, (ii) the green emitted light is characterized by a green emitted color point, (iii) the blue emitted light is characterized by a blue emitted color point, and (iv) over at least an upper portion of an operational range of electrical drive currents applied to the one or more red, green, and blue LEDs, the red, green, and blue emitted color points define a color gamut that fails to encompass an sRGB color gamut.

Example 5. The light-emitting device of anyone of Examples 1 through 4, the red emitted light being characterized by a red emitted color point having a dominant wavelength that is shorter than a dominant wavelength of the red output color point.

Example 6. The light-emitting device of any one of Examples 1 through 5 wherein (i) the green emitted light is characterized by a green emitted color point that is the same as the green output color point, or (ii) the blue emitted light is characterized by a blue emitted color point that is the same as the blue output color point.

Example 7. The light-emitting device of any one of Examples 1 through 6 wherein (i) the one or more green LEDs comprise one or more InGaN-based green LEDs, and (ii) the one or more blue LEDs comprise one or more InGaN-based blue LEDs.

Example 8. The light-emitting device of any one of Examples 1 through 7, the red, green, and blue LEDs being arranged in a single layer as a two-dimensional array with the corresponding output surfaces of the red, green, and blue LEDs forming an output surface of the array.

Example 9. The light-emitting device of Example 8, the one or more spectrally selective optical elements comprising one or more continuous optical filtering layers positioned opposite output surfaces of the red, green, and blue LEDs of the array.

Example 10. The light-emitting device of Example 8, the one or more spectrally selective optical elements comprising multiple discrete optical filtering elements, the discrete optical filtering elements being positioned opposite corresponding output surfaces of at least corresponding red LEDs of the array.

Example 11. The light-emitting device of any one of Examples 1 through 7, the red, green, and blue LEDs being arranged in one or more LED stacks, each LED stack including at least one of the one or more red LEDs, at least one of the one or more green LEDs, and at least one of the one or more blue LEDs, so that the red output light, the green output light, and the blue output light exit each LED stack from an output surface thereof.

Example 12. The light-emitting device of Example 11, the one or more spectrally selective optical elements including a corresponding notch or long-pass optical filter, positioned between the red LED of each LED stack and the corresponding green LED, blue LED, and output surface of that LED stack, the notch or long-pass optical filter being arranged so as to reduce or eliminate transmission of a short-wavelength portion of an optical spectrum of the red emitted light, so as to reduce or eliminate that short-wavelength portion from the red output light.

Example 13. The light-emitting device of Example 11, the one or more spectrally selective optical elements including a corresponding notch optical filter, positioned so that the red, green, and blue output light propagates away from the output surface of each LED stack through the notch optical filter, the notch optical filter being arranged so as to reduce or eliminate transmission of a short-wavelength portion of an optical spectrum of the red emitted light, so as to reduce or eliminate that short-wavelength portion from the red output light.

Example 14. The light-emitting device of any one of Examples 11 through 13, the LED stacks of red, green, and blue LEDs being arranged as a two-dimensional array with the corresponding output surfaces of the LED stacks forming an output surface of the array.

Example 15. The light-emitting device of Example 14, the one or more spectrally selective optical elements comprising one or more continuous optical filtering layers positioned opposite output surfaces of the LED stacks of the array.

Example 16. The light-emitting device of Example 14, the one or more spectrally selective optical elements comprising multiple discrete optical filtering elements, the optical filtering elements being positioned opposite corresponding output surfaces of corresponding LED stacks of the array.

Example 17. The light-emitting device of any one of Examples 8 through 10 or Examples 14 through 16 further comprising a control circuit connected to the array and arranged so as to enable independent operation of single LEDs or groups of LEDs of the array.

Example 18. The light-emitting device of any one of Examples 1 through 17, the one or more spectrally selective optical elements including one or more optical elements that exhibit spectrally selective optical absorption.

Example 19. The light-emitting device of any one of Examples 1 through 18, the one or more spectrally selective optical elements including one or more optical elements that exhibit spectrally selective optical reflectivity and transmittivity.

Example 20. The light-emitting device of any one of Examples 1 through 19, the one or more spectrally selective optical elements being positioned opposite corresponding output surfaces of corresponding red, green, or blue LEDs.

Example 21. The light-emitting device of any one of Examples 1 through 20, the one or more spectrally selective optical elements forming portions of corresponding electrodes of corresponding red, green, or blue LEDs, or being positioned between the corresponding electrodes and the corresponding red, green, or blue LEDs.

Example 22. The light-emitting device of any one of Examples 1 through 21, further comprising one or more primary optical elements positioned between corresponding output surfaces of one or more of the red, green, or blue LEDs and one or more of the one or more spectrally selective optical elements.

Example 23. The light-emitting device of any one of Examples 1 through 22, further comprising one or more primary optical elements positioned over corresponding output surfaces of one or more of the red, green, or blue LEDs with corresponding spectrally selective optical elements being positioned between the primary optical element and the corresponding output surface.

This disclosure is illustrative and not limiting. Further modifications will be apparent to one skilled in the art in light of this disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each.

For purposes of the present disclosure or appended claims, when a numerical quantity is recited (with or without terms such as "about," "about equal to," "substantially equal to," "greater than about," "less than about," and so forth), standard conventions pertaining to measurement precision, rounding error, and significant digits shall apply, unless a differing interpretation is explicitly set forth, or if a differing interpretation is implicit or inherent (e.g., some small integer quantities). For null quantities described by phrases such as "equal to zero," "absent," "eliminated," "negligible," "prevented," and so forth (with or without terms such as "about," "substantially," and so forth), each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled. Terms such as "parallel," "perpendicular," "orthogonal," "flush," "aligned," and so forth shall be similarly interpreted (with or without terms such as "about," "substantially," and so forth).

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A light-emitting device comprising:

one or more red InGaN-based light-emitting diodes (LEDs) arranged to emit direct-emitted red light;

one or more green III-nitride-based LEDs arranged to emit direct-emitted green light;

one or more blue III-nitride-based LEDs arranged to emit direct-emitted blue light; and one or more spectrally selective optical elements positioned and arranged so that (i) at least the direct-emitted red light is incident on one or more of the one or more spectrally selective optical elements, and (ii) output portions of the red, green, and blue direct-emitted lights exit the device as red output light characterized by a red output color point, green output light characterized by a green output color point, and blue output light characterized by a blue output color point, respectively, the red, green, and blue output color points defining an output color gamut that encompasses at least an sRGB color gamut.

2. The light-emitting device of claim 1, the direct-emitted red light being characterized by a spectrum full width at half maximum greater than 30 nm.

3. The light-emitting device of claim 1, the one or more spectrally selective optical elements including one or more notch or long-pass optical filters arranged so as to reduce or eliminate transmission of a short-wavelength portion of an optical spectrum of the direct-emitted red light, so as to reduce or eliminate the short-wavelength portion from the red output light.

4. The light-emitting device of claim 1 wherein (i) the direct-emitted red light is characterized by a red emitted color point, (ii) the direct-emitted green light is characterized by a green emitted color point, (iii) the direct-emitted blue light is characterized by a blue emitted color point, and (iv) over at least an upper portion of an operational range of electrical drive currents applied to the one or more red, green, and blue LEDs, the red, green, and blue emitted color points define a color gamut that fails to encompass the sRGB color gamut.

5. The light-emitting device of claim 4 wherein over at least a lower portion of an operational range of electrical drive currents applied to the one or more red, green, and blue LEDs, the red, green, and blue emitted color points define a color gamut that encompasses the sRGB color gamut.

6. The light-emitting device of claim 1, the direct-emitted red light being characterized by a red emitted color point having a dominant wavelength that is shorter than a dominant wavelength of the red output color point.

7. The light-emitting device of claim 1 wherein (i) the one or more green LEDs comprise one or more InGaN-based green LEDs, and (ii) the one or more blue LEDs comprise one or more InGaN-based blue LEDs.

8. The light-emitting device of claim 1, the red, green, and blue LEDs being arranged in a single layer as a two-dimensional array with the corresponding output surfaces of the red, green, and blue LEDs forming an output surface of the array.

9. The light-emitting device of claim 8, the one or more spectrally selective optical elements comprising one or more continuous optical filtering layers positioned opposite output surfaces of the red, green, and blue LEDs of the array.

10. The light-emitting device of claim 8, the one or more spectrally selective optical elements comprising multiple discrete optical filtering elements, the discrete optical filtering elements being positioned opposite corresponding output surfaces of at least corresponding red LEDs of the array.

11. The light-emitting device of claim 1, the one or more spectrally selective optical elements including (i) one or more optical elements that exhibit spectrally selective optical absorption, or (ii) one or more optical elements that exhibit spectrally selective optical reflectivity and transmittivity.

12. The light-emitting device of claim 1, the one or more spectrally selective optical elements being positioned opposite corresponding output surfaces of corresponding red, green, or blue LEDs.

13. The light-emitting device of claim 1, the one or more spectrally selective optical elements forming portions of corresponding electrodes of corresponding red, green, or blue LEDs, or being positioned between the corresponding electrodes and the corresponding red, green, or blue LEDs.

14. The light-emitting device of claim 1, further comprising one or more primary optical elements positioned between corresponding output surfaces of one or more of the red, green, or blue LEDs and one or more of the one or more spectrally selective optical elements.

15. The light-emitting device of claim 1, further comprising one or more primary optical elements positioned over corresponding output surfaces of one or more of the red, green, or blue LEDs with corresponding spectrally selective optical elements being positioned between the primary optical element and the corresponding output surface.

16. A light-emitting device comprising:

one or more red InGaN-based light-emitting diodes (LEDs) arranged to emit direct-emitted red light;

one or more green III-nitride-based LEDs arranged to emit direct-emitted green light;

one or more blue III-nitride-based LEDs arranged to emit direct-emitted blue light; and one or more spectrally selective optical elements positioned and arranged so that (i) at least the direct-emitted red light is incident on one or more of the one or more spectrally selective optical elements, and (ii) output portions of the red, green, and blue direct-emitted lights exit the device as red output light characterized by a red output color point, green output light characterized by a green output color point, and blue output light characterized by a blue output color point, respectively, the red, green, and blue output color points defining an output color gamut that encompasses at least an sRGB color gamut, the red, green, and blue LEDs being arranged in one or more LED stacks, each LED stack including at least one of the one or more red LEDs, at least one of the one or more green LEDs, and at least one of the one or more blue LEDs, so that the red output light, the green output light, and the blue output light exit each LED stack from an output surface thereof.

17. The light-emitting device of claim 16, the one or more spectrally selective optical elements including a corresponding notch or long-pass optical filter, positioned between the red LED of each LED stack and the corresponding green LED, blue LED, and output surface of the LED stack, the notch or long-pass optical filter being arranged so as to reduce or eliminate transmission of a short-wavelength portion of an optical spectrum of the direct-emitted red light, so as to reduce or eliminate the short-wavelength portion from the red output light.

18. The light-emitting device of claim 16, the one or more spectrally selective optical elements including a corresponding notch optical filter, positioned so that the red, green, and blue output lights propagate away from the output surface of each LED stack through the notch optical filter, the notch optical filter being arranged so as to reduce or eliminate transmission of a short-wavelength portion of an optical spectrum of the direct-emitted red light, so as to reduce or eliminate the short-wavelength portion from the red output light.

19. The light-emitting device of claim 16, the LED stacks of red, green, and blue LEDs being arranged as a two-dimensional array with the corresponding output surfaces of the LED stacks forming an output surface of the array.

20. The light-emitting device of claim 19, the one or more spectrally selective optical elements comprising one or more continuous optical filtering layers positioned opposite the corresponding output surfaces of the LED stacks of the array.

21. The light-emitting device of claim 19, the one or more spectrally selective optical elements comprising multiple discrete optical filtering elements, the optical filtering elements being positioned opposite the corresponding output surfaces of corresponding LED stacks of the array.

* * * * *